US012284772B2

(12) United States Patent
Artale et al.

(10) Patent No.: US 12,284,772 B2
(45) Date of Patent: Apr. 22, 2025

(54) FREESTANDING LOCKING SUPPORT WALL SYSTEM

(71) Applicant: Atomic Design, Inc., Lititz, PA (US)

(72) Inventors: Nicolas Artale, Lancaster, PA (US); Conway S. Allison, East Petersburg, PA (US)

(73) Assignee: Atomic Design, Inc., Lititz, PA (US)

( * ) Notice: Subject to any disclaimer, the term of this patent is extended or adjusted under 35 U.S.C. 154(b) by 262 days.

(21) Appl. No.: 17/901,317

(22) Filed: Sep. 1, 2022

(65) Prior Publication Data
US 2024/0080995 A1 Mar. 7, 2024

(51) Int. Cl.
*H05K 5/00* (2006.01)
*H05K 5/02* (2006.01)

(52) U.S. Cl.
CPC ......... *H05K 5/0021* (2013.01); *H05K 5/0234* (2013.01)

(58) Field of Classification Search
CPC ........................... H05K 5/0021; H05K 5/0234
USPC .................... 361/730, 728, 807, 809, 810
See application file for complete search history.

(56) References Cited

U.S. PATENT DOCUMENTS

| 5,588,240 A | * | 12/1996 | Zilliox | G09F 1/12 |
| | | | | 40/605 |
| 11,943,880 B2 | * | 3/2024 | Holroyd | H05K 5/0017 |
| 2023/0066309 A1 | * | 3/2023 | Ouimet | F16M 11/105 |

FOREIGN PATENT DOCUMENTS

CN  111878495 A  * 11/2020  ............. F16B 12/12

OTHER PUBLICATIONS https://routledgetextbooks.com/textbooks/9780415717526/data/L-Jacks.pdf, Copyright 2010, 4 pages.

* cited by examiner

*Primary Examiner* — Hung S. Bui
(74) *Attorney, Agent, or Firm* — Barley Snyder

(57) ABSTRACT

A modular display panel system providing a plurality of modular display panels that can be connected together to form a larger display than any of the display panels. The display panel system has at least one modular display panel that can be releasably secured to at least one other modular display panel. The modular display panel has a panel, a frame assembly, and a jack assembly. The panel providing a display surface on the front and configured to be releasably secured to the frame assembly. The frame assembly having a rectangular structure and providing a first stile, a second stile, a top plate, a bottom plate, and at least one toggle. The first stile having at least one connector and a trifunctional mortise; and the second stile having at least one second connector and a trifunctional mortise. The jack assembly provides a jack leg pivotably secured to the frame assembly, and a locking brace pivotably secured to the jack leg.

20 Claims, 23 Drawing Sheets

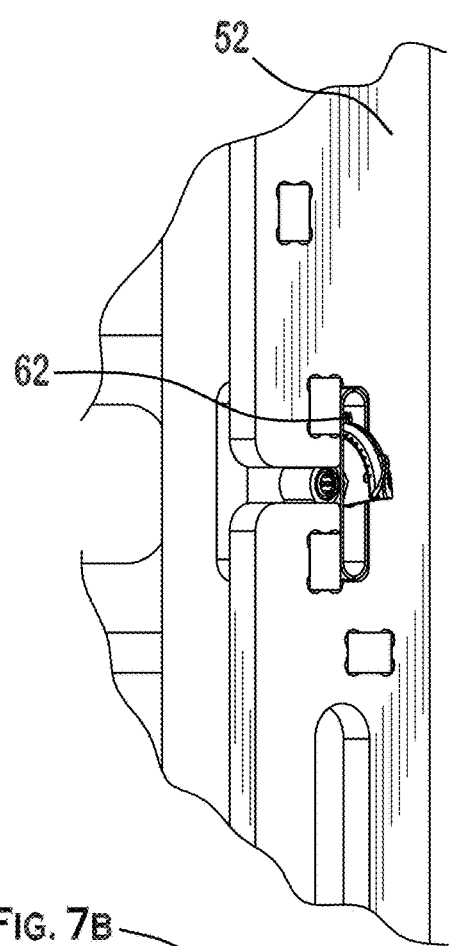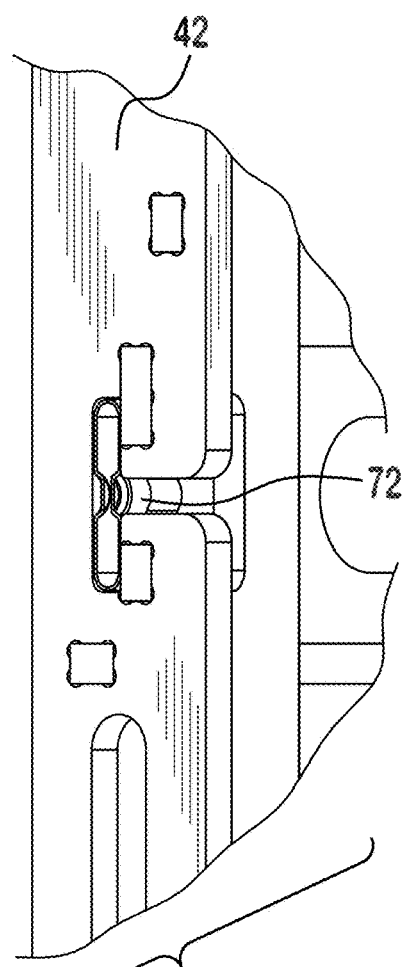
FIG. 7B
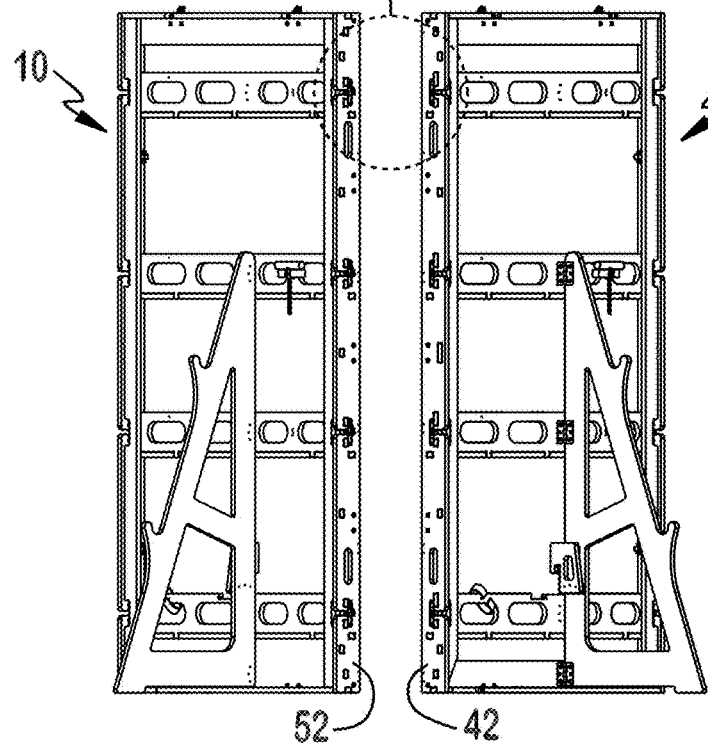
FIG. 7A

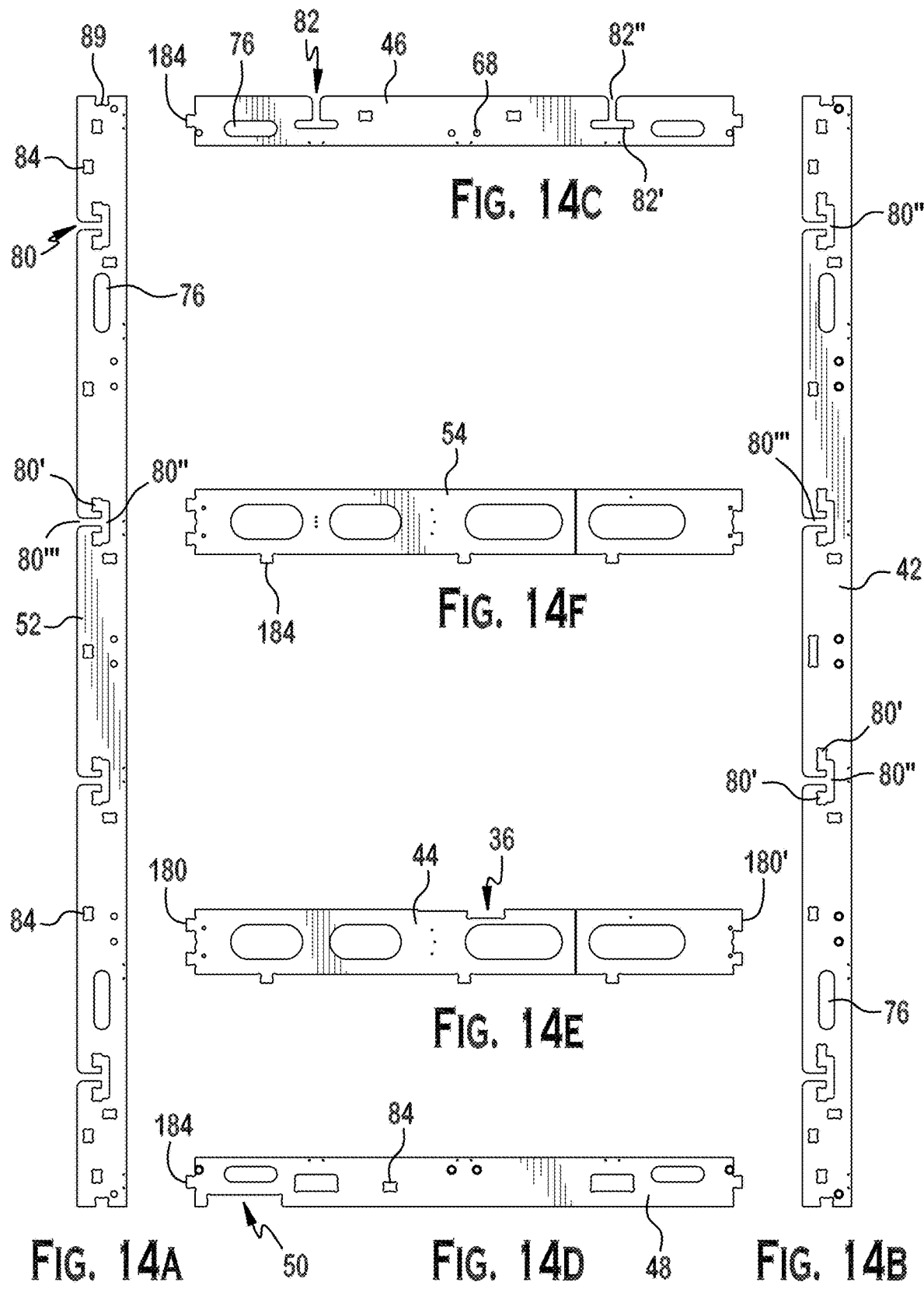

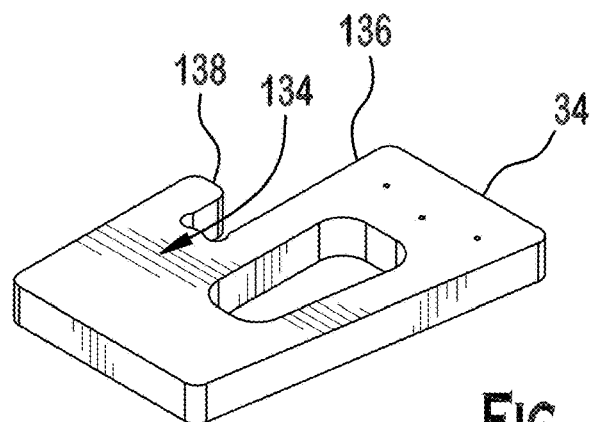
FIG. 15B
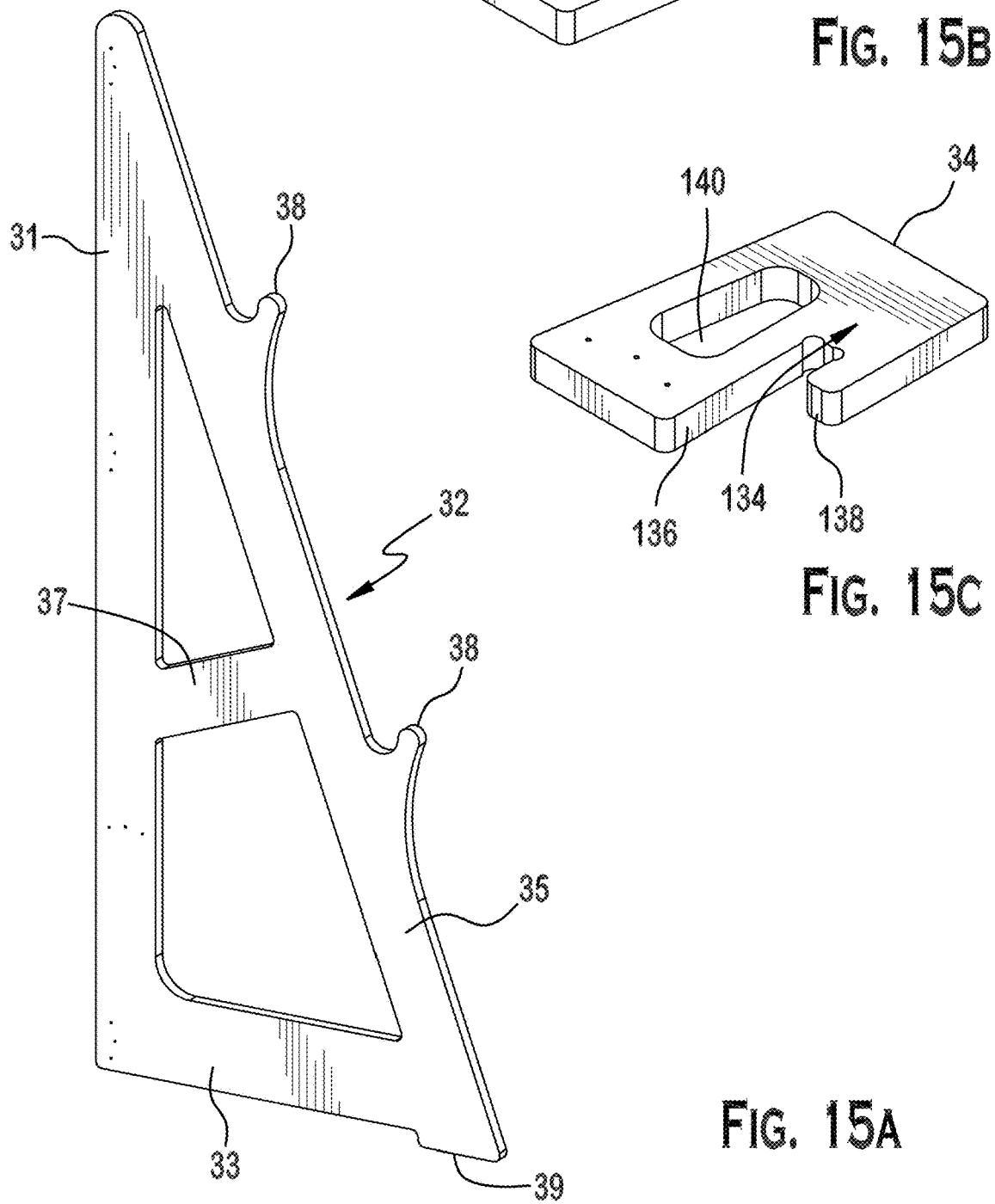
FIG. 15C
FIG. 15A

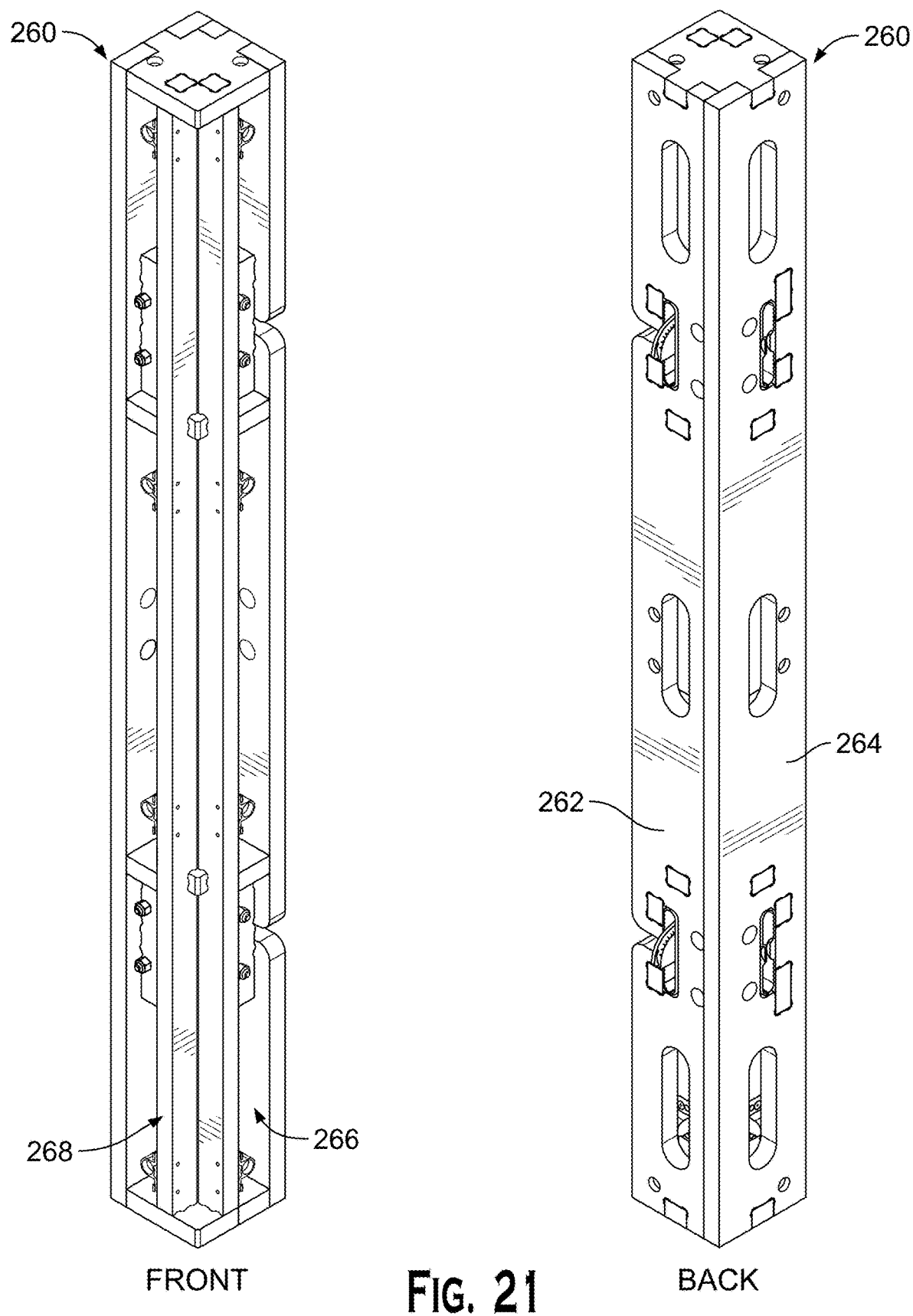
FRONT    FIG. 21    BACK

FREESTANDING LOCKING SUPPORT WALL SYSTEM

FIELD OF THE INVENTION

The invention relates to backdrop display panels that can be provided as modular units and, more particularly, to freestanding backdrop display panel systems configured for connecting a plurality of modular panels to provide a freestanding locking support wall system.

BACKGROUND

Decorative displays are commonly used in stage and set design. Generally, such backdrop displays, may be provided as theater flat, often created by assembling framing components to a rectangular shape, and covered with a paintable cloth or wood surface covering. Such theater flats may be provided for display using various methods, including being: suspended from battens above the stage; affixed to suitable structure; or alternatively, free standing flats kept upright through the use of a brace, for example in the form of an L-jack protruding backwards from the theater flat, typically perpendicular to the planar front face of the flat. It is also known that multiple flats may be joined together to form a larger image surface and may be positioned upright by any of the methods discussed above, or alternatively by being joined at an angle together with another theater flat to form a self-standing backdrop.

Traditional theater flats are known to be broken down for storage when not in use and are capable of being stacked with the flat planar surfaces resting atop another, thereby minimizing the space required for storage. Such stacked storage however, often requires removal of the L-jack that otherwise protrudes away from the flat surface. It is also known an L-jack may be hinge mounted and be capable of being folded.

In order to help stabilize the theater flat displays, it is known to place a weight on the L-Jack, placed near the junction of the diagonal brace and the horizontal rail, in between the diagonal brace and the horizontal rail, in order to shift the center of gravity to a point located behind the display panel, and thereby help maintain the flat in an upright position. Such a weight is often in the form of a sandbag.

Such known theater displays are typically custom made, and typically do not rely on mass production techniques. As such, the custom panels frequently vary in how straight and true the edges of the panels are, as well as varying in quality, dimensional tolerance. Frequently, the variability is such that adjoining panels will be joined with an easily discernible seam. To accommodate for the misalignment of such adjoining panels, seams are frequently covered in tape, such as masking tape, or gaffer's tape, and the taped surface is then painted along with the flat panel surfaces to provide an acceptable appearance from the audience perspective.

Traditionally, multiple theater flats are connected together using a lash line cleat, with cleats provided on the inside edges of framing for each of the flats, and a cord lashed to each of the cleats of the adjoining panels, thereby securing the panels together. Alternatively, flats may be fixed together with screws applied through adjoining frame members, or through the use of coffin locks, where two-part connectors are provided in a mortise created in each of the frames, and the two-part connectors can be locked together.

There is a need for a display system that can be constructed using automated techniques to ensure reliable dimension, and providing reliable dimensions, such that multiple panels can be connected together quickly, and multiple panels can be assembled to provide a larger display comprised of multiple modular panels.

SUMMARY

Therefore, the invention relates to a display panel system and includes a plurality of modular display panels, each utilizing modular framing components and connectors. The plurality of modular display panels may be positioned adjacent to each other in an array, with connectors provided in the modular framing components. The mortise cavity may be shaped to provide a first region to receive the blind connector, a second region to receive at least one tenon, and a third region forming a tool receiving passageway. Such a mortise cavity may be provided in modular framing components, such as may be created using automated milling techniques to provide dimensionally accurate framing components for the modular display panels.

In an embodiment, the display panel system has at least one modular display panel that can be releasably secured to at least one other modular display panel. In an embodiment, a modular display panel has a panel, a frame assembly, and a jack assembly. The panel has a display surface on the front and is configured to be releasably secured to the frame assembly. The fame assembly has a rectangular structure having a first stile, a second stile, a top plate, a bottom plate, and at least one toggle arranged between the top plate and the bottom plate. The first stile having at least one first connector and trifunctional mortise, and the second stile having at least one second connector and trifunctional mortise. The jack assembly providing a jack leg pivotably secured to the frame assembly, and a locking brace that is pivotably secured to the jack leg.

In an embodiment, the trifunctional mortise is a single cavity defining a first region, a second region and a third region, where the first region may receive at least one tenon therein, the second region may receive a first connector therein, and the third region provides a first key passageway for accessing the connector with a tool. In an embodiment, the first region of the trifunctional mortise may be discontinuous, and may receive a pair of tenons, with one tenon directed into each of the discontinuous portions of the first region. In an embodiment, at least one of the top plate or bottom plate may have at least one first connector and a bifunctional mortise in the form of a single cavity defining a first region and a second region, where the first region may receive the connector therein, and the second region provides another key passageway for accessing the connector in the bifunctional mortise with a tool.

In an embodiment, the modular display panel may be rectangular and have a height to width ratio that a whole number ratio, and is selected for example, from 2:1, 3:1, 4;1, or 1:1.

In an embodiment, the modular display panel may have a plurality of female connectors in the first stile, and a plurality of male connectors in the second stile, wherein each one of the female connectors of the plurality of female connectors is aligned with another one of the male connectors of the plurality of male connectors. In an exemplary embodiment, the modular display panel may have at least one male connector on the top plate, and at least one female connector on the bottom plate.

In an embodiment, the panel of the modular display panel is self-supporting, and provides a display surface, and has a back surface with at least one releasable fastener clip configured to be received by a corresponding receiver that is mechanically secured to the frame assembly.

In an embodiment of the display panel system, the frame assembly has four toggles, and the lowermost toggle is configured to engage with or receive a portion of the locking brace. In an embodiment, the frame assembly further includes a first stile rail, a second stile rail, a top plate rail, a bottom plate rail, and a toggle rail for each of the four toggles. In an embodiment, each of the toggles may provide a biased tenon arrangement on one end.

In an exemplary embodiment, the modular display panels have a jack leg that features a spine, a diagonal brace extending diagonally away from the top of the spine, and a horizontal leg extending horizontally out from the bottom of the spine, and the horizontal leg may end in a downward protruding foot. The jack leg may also provide at least one weight receiving feature. In an embodiment, the jack leg may pivot between a first position and a second position, where the first position of the jack leg has the jack leg stowed entirely within the outside dimensions of the frame assembly; while the second position of the jack leg has the jack leg protruding perpendicularly away from the panel. In an embodiment, the locking brace of the jack assembly may pivot between a storage position and a locking position, where in the storage position, the locking brace may be folded against the jack leg, and in the locking position, the locking brace may be positioned protruding perpendicularly away from the jack leg and having an engagement portion of the locking brace mechanically engaged with the bottom toggle. In an embodiment, the jack leg may further comprise a diagonal rail extending between the spine, at a mid-point of the spine, to the diagonal brace, at a mid-point of the diagonal brace.

In an exemplary embodiment, the modular panel display system comprises three modular display panels that are arranged in a configuration having two modular display panels positioned vertically, and a third modular display panel positioned horizontally atop the other two modular display panels.

In an exemplary embodiment, the modular panel display system comprises a corner connector configured to join a pair of modular display panels in a non-planar configuration.

BRIEF DESCRIPTION OF THE DRAWINGS

The invention will be explained in greater detail in the following with reference to embodiments, referring to the appended drawings, in which:

FIG. 7a is a rear perspective view of a pair of modular display panels according to an embodiment of the invention, and positioned near each other prior to being joined;

FIG. 7b is an expanded detailed view of the edges of the panels depicted in FIG. 7a, and showing in detail the male connector provided in a second stile of the left panel, and a female connector provided in the first stile of the right panel, and depicting the trifunctional mortise according to an embodiment of the invention;

FIG. 14a-f are profile views of the major components of the frame assembly of an exemplary modular display panel according to an embodiment of the invention;

FIGS. 15a, b and c depict the components of an exemplary jack assembly of the modular display panel according to an embodiment of the invention, with FIG. 15a depicting an exemplary jack leg according to an embodiment of the invention; and FIGS. 15b and c are different perspective view of an exemplary locking brace according to an embodiment of the invention;

FIG. 17b is a front perspective view of the portion of the modular display panel of FIG. 17a;

FIG. 21 provides front and back perspective views of another exemplary embodiment of a corner connector for use in a non-planar display system, according to an embodiment of the invention.

DETAILED DESCRIPTION OF THE EMBODIMENT(S)

Embodiments of the invention will now be described in greater detail with reference to the drawings.

Figure 1:
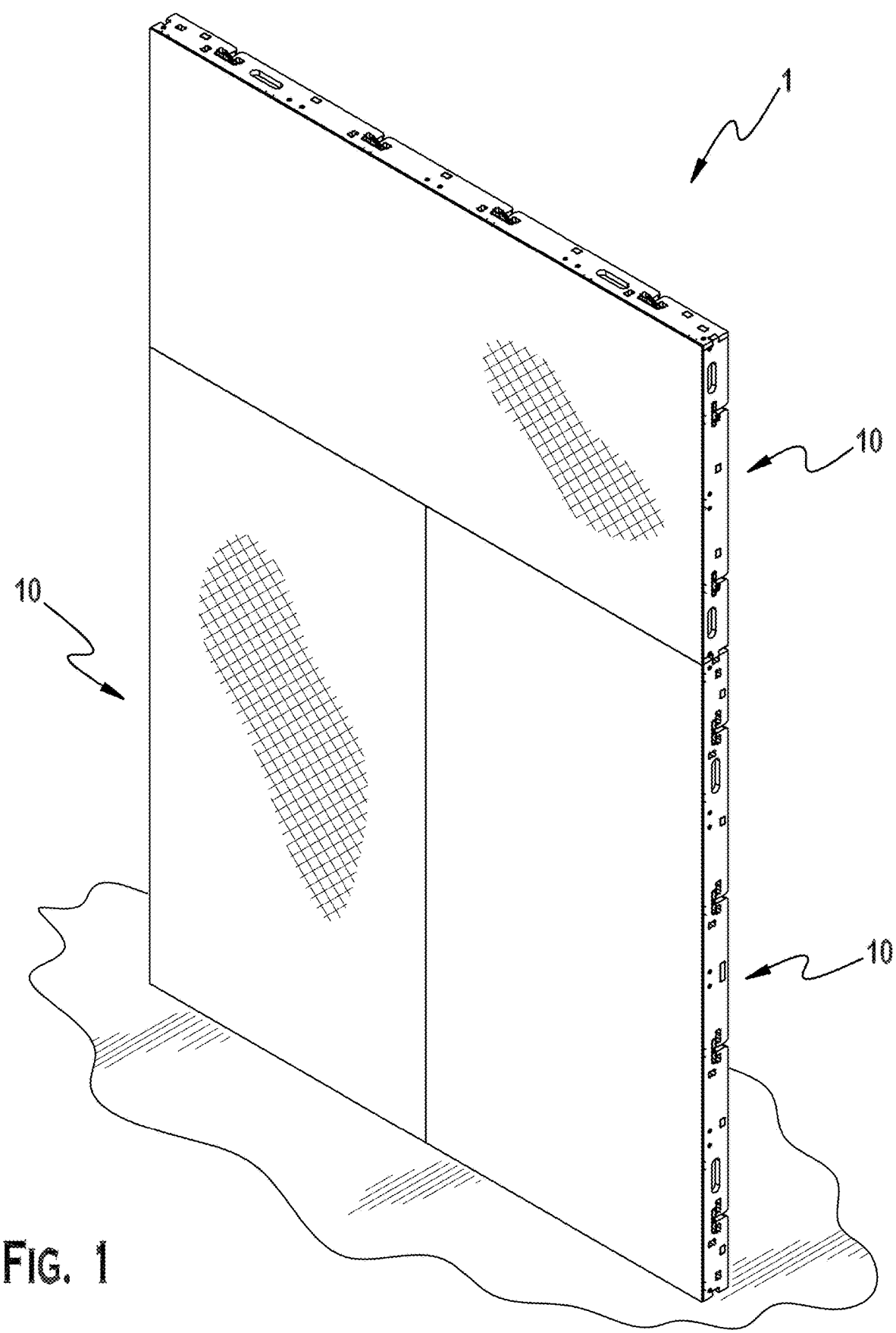
FIG. 1 is a front perspective view of a modular display panel system according to an embodiment of the invention.
Figure 2:
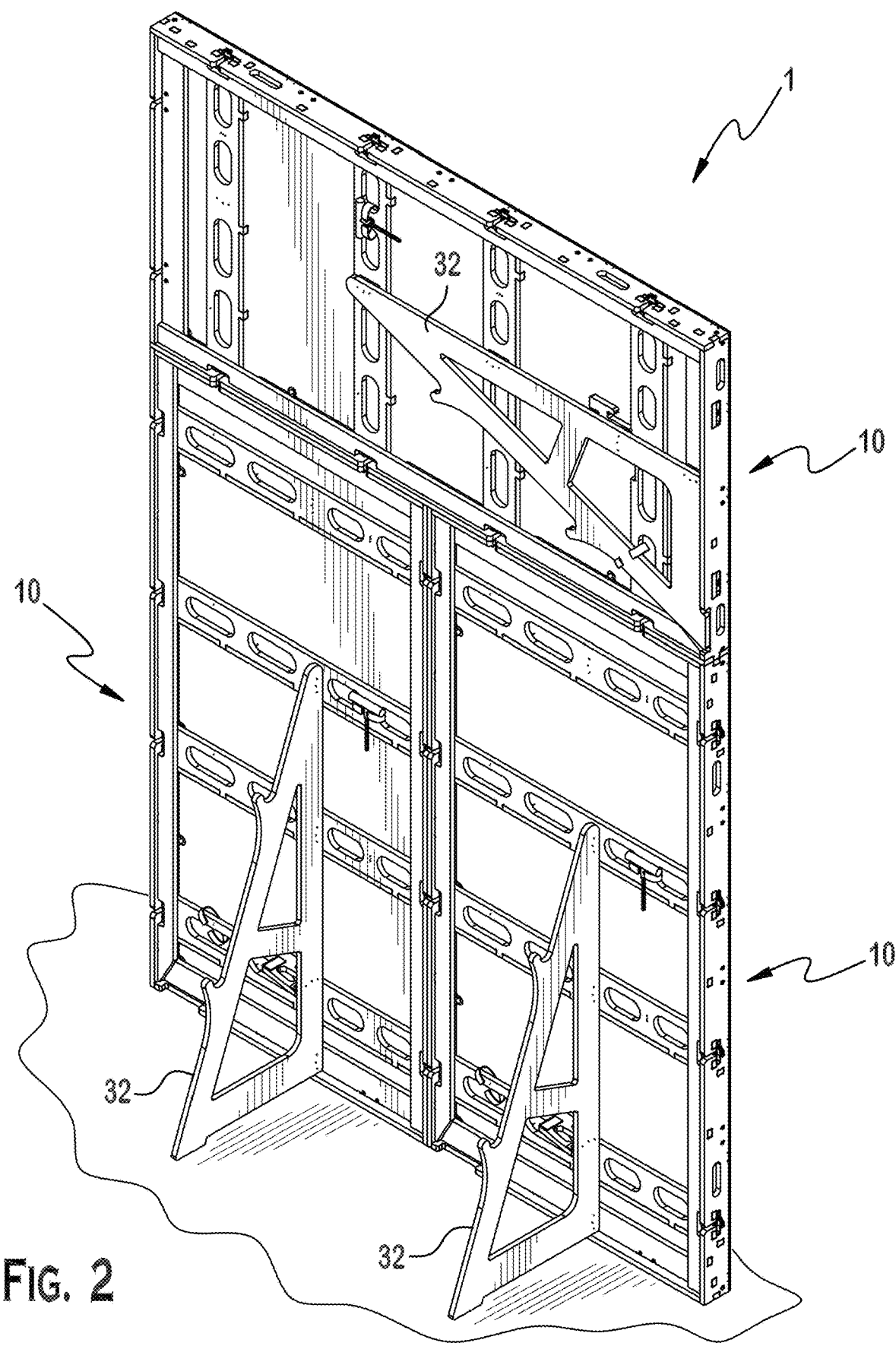
FIG. 2 is a rear perspective view of the modular display panel system of FIG. 1.

Referring first to FIGS. 1 and 2, an exemplary embodiment of a display panel system 1 is shown from a front perspective view (FIG. 1) and a rear perspective view (FIG. 2). According to an embodiment of the invention, the display panel system 1 includes a plurality of modular panels 10 that have been assembled and secured together to provide a multi-panel backdrop or display surface. The plurality of panels may be arranged in any suitable combination to present a generally uniform display surface. As shown in the embodiment of FIGS. 1 and 2, the modular panel system 1 provides a plurality of panels 10 depicted here in a configuration having a pair of adjoining panels 10 that are vertically oriented (e.g., having the long axis arranged in a vertical direction), with another panel 10 that is horizontally oriented and extended across the top of the two lower panels 10, and secured thereto. It is further contemplated that additional vertical panels may be provided as adjoining panels that will extend the width of the display surface and may be similarly topped with additional horizontally arranged panels as desired. One skilled in the art will realize that different configurations of panels 10 may be assembled to provide a variety of sizes of integrated display panels, by varying the number and orientations of the panels as desired. Care should be taken to ensure that the integrated display panel, comprising a plurality of individual display panels 10 secured relative to each other, will remain upright, using the techniques described herein. Additionally, it is recognized that additional measures may be taken, such as through the providing of additional bracing components beyond those provided within the modular panel display system 1, in order to brace the system and keep the panels upright for use. It is anticipated that using the components described herein, the panels may be configured, is suitable configurations, for example in the embodiments shown in FIG. 10, and safely remain upright, using the teachings herein. As shown, the vertically oriented panels 10 may be kept in a free-standing upright position through the deployment of a jack assembly 30 having a jack leg 32, as will be discussed. It is further contemplated that additional supports not depicted herein may further be provided, including suspending the system 1 from battens or other suitable overhead structures, or secured to other structures for larger assemblies of panels.

Figure 9:
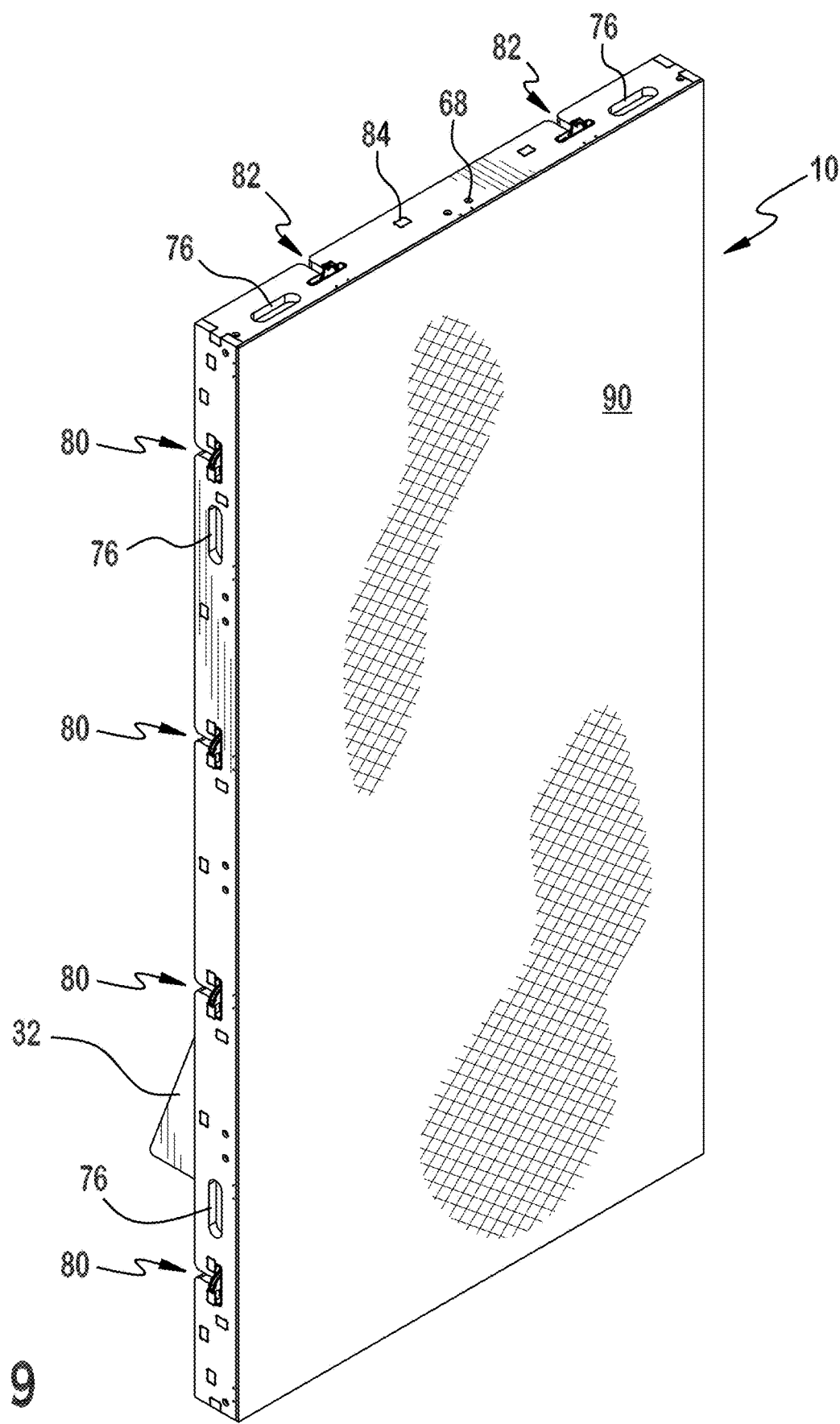
FIG. 9 is front perspective view of an exemplary modular display panel having a panel, frame assembly, and jack assembly, according to an embodiment of the invention.
Figure 10:
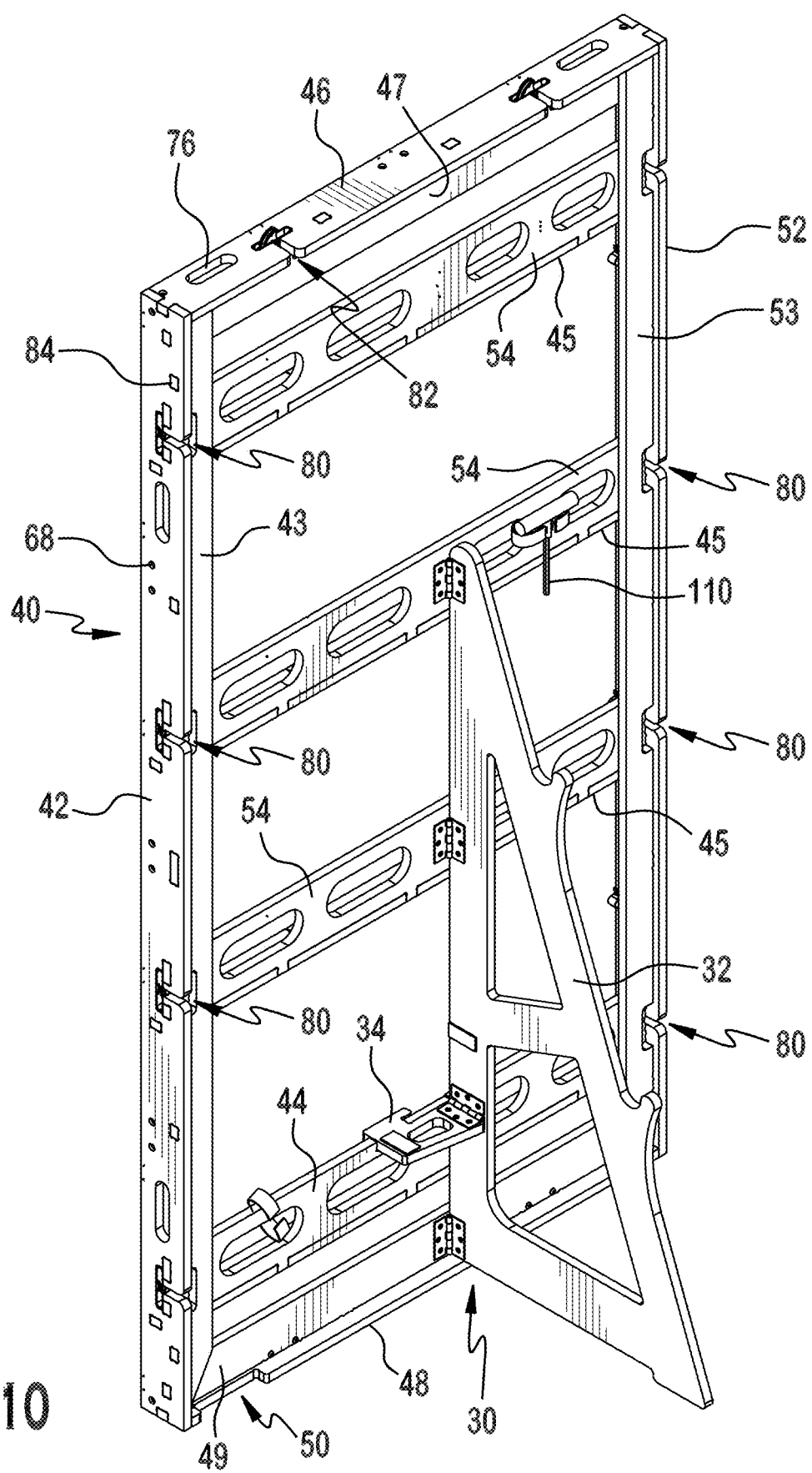
FIG. 10 is a rear perspective view of the modular display panel of FIG. 9.

As shown in FIGS. 9 and 10, an isolated modular display panel 10 according to an embodiment of the invention, is shown in front perspective view (FIG. 9) and rear perspective view (FIG. 10). It is contemplated that multiple display panels 10 could be assembled together to provide the modular panel system 1 according to an embodiment of the invention. As shown in the embodiment of FIGS. 9 and 10, each display panel 10 includes at least the following major components: a frame assembly 40, a jack assembly 30, and a panel 90.

As shown in FIG. 9, each modular display panel 10 is a shaped article, here provided generally as a rectangular form. The size of the modular display panel 10 may be varied to suit the particular need. In the embodiment depicted in FIG. 9, the dimensions of the modular display panel are such that the height of the vertically oriented display panel 10 is twice the width dimension (providing a 2:1 ratio of height:width), which may beneficially allow combining panels in the system in different orientations easily. One skilled in the art will recognize that display panels 10 may alternatively be provided as squares, having height and width of the same dimensions (providing a 1:1 ratio of height:width), or other sizes and forms as may be desired, for example, using the teachings herein, one may adjust the display panel 10 such that the width would be ⅓ or ¼ of the height, as non-limiting examples. In a representative embodiment, the modular display panel 10 may have a height dimension that is approximately 45 inches wide, and approximately 90 inches tall, though one skilled in the art will recognize that the dimensions could easily be adjusted upwards or downwards as desired, and in an embodiment selected to provide dimensions that maintain an appropriate whole number ratio of the height:width dimensions (e.g., 2:1, 3:1, 4:1, 1:1, etc.). The frame assembly 40 may have any suitable dimensions, to allow adequate strength and rigidity for assembling multiple display panels 10 together in the modular panel display system 1. In the embodiment depicted in FIG. 9, the frame assembly 40 has a height and width that conforms with that of the display panel 10, as described above, and may have a depth of approximately 4 inches. The selection of the dimensions and the materials may be made with the aim of minimizing weight, balanced against the providing of adequate strength and rigidity for the modular display panel 10, as will be familiar to those of skill in the art, in order to allow ease of assembly, transport and storage of the components of the modular display system 1.

Figure 11B:
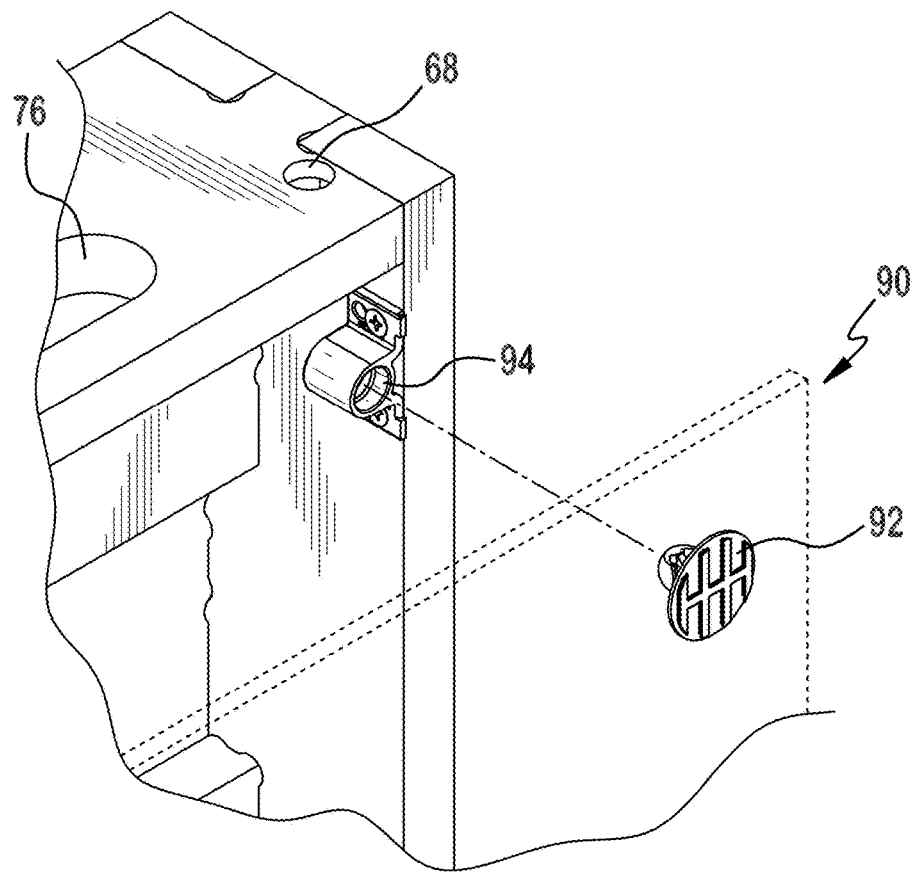
FIG. 11b is an expanded detailed view of the frame assembly of FIG. 11a, showing the placement of panel clips provided on rear surface of the panel, depicted in phantom, and the positioning of the panel clip receivers on the frame assembly, according to an embodiment of the invention.
Figure 11A:
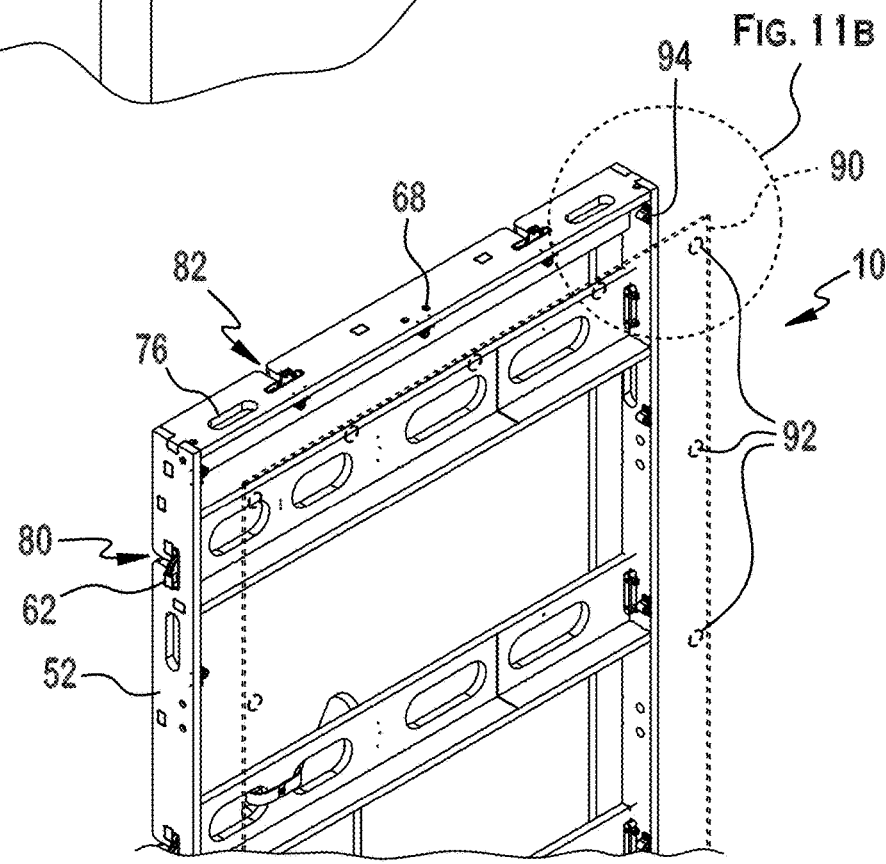
FIG. 11a is a front perspective partial view of the frame assembly of a modular display panel according to an embodiment of the invention, with a front panel having been positioned in front of the frame assembly and depicted in phantom for ease of viewing the frame assembly components and the receiver clips for securing the panel to the frame assembly.

As depicted in FIG. 9, the front of the modular display panel 10 features a front facing display surface provided on a panel 90. In an embodiment, the panel 90 may be made from textured material, but could be prepared from a variety of display materials, such as fiberboard, paper, plastic, wood, metal, or other material that fits the requirements of a particular use. One skilled in the art would appreciate that the shape, size, and texture of the modular panel 90 can be modified and designed for a particular use. As depicted in FIG. 9, the panel 90 may be provided as a generally planar material, with dimensions in height and width that substantially align with those dimensions of the frame assembly 40, for example, when viewed from the front. With reference to FIGS. 11a and 11b, the panel 90 may be a self-supporting planar material (e.g., wood, polymer sheet, foam board, as non-limiting examples) that can be secured to the frame assembly using any suitable mounting technique known to those of skill in the art. The term "self-supporting" indicates that the panel would be capable of being held upright at approximately a mid-height along its length and substantially maintain its initial shape, in contrast to a fabric material, which would not be self-supporting, as when held at mid-height, gravity would cause the top portion of the fabric material to naturally fall towards the bottom portion of the panel and would not retain the initial shape. It is contemplated that releasable fasteners, such as clips, hook and loop connectors, or magnetic connectors that engage with corresponding connector components of the frame assembly, and provided in any suitable location, such as locations on the back surface of the panel 90 will allow the user to easily remove and replace the front panel, allowing for customization of the modular display system 1 in order to provide for different graphics, images, or textures, or to replace panels 90 that may become damaged, as may be desired for a backdrop or display. In the embodiment depicted in the detail view of FIG. 11b, quick release mounting clips 92 may be utilized by being secured in any suitable fashion, for example through the use of an adhesive, to various locations on the back side of the panel 90. These locations are to be aligned with corresponding connector components, such as receivers or mounting clips provided on the frame assembly 40, such that the mounting clips 92 of the panels will be received within panel clip receivers 94, as the panel is aligned with the frame assembly and secured thereto. As shown, the mounting clips 92 may be quick release clips, that utilize friction or tension to retain the clips 92 within the clip receivers 94, but still allow the removal or replacement of the panel 90 on the frame assembly 40.

In another embodiment, the panel may be a non-self-supporting material, such as a fabric, that can be placed over and secured to a panel subframe (not shown), to provide a suitable front face for the display panel 10, for example, where the fabric material stretched over the subframe. In the embodiment of the panel 90 using a subframe, the subframe is to be a structure that may be affixed to the frame assembly 40, using any of the mounting techniques described herein. It is further contemplated that the panel 90 may be non-self-supporting material that may be secured in any suitable manner, directly to the frame assembly, including through the use of staples, screws, nails, and adhesives, in addition to the clips as taught herein.

In the embodiment where the panel is a self-supporting material, the panel 90 may be a rigid foam board, and may be a laminate or homogenous foam board, for example a closed-cell, free foam, rigid polymer sheet, such as a PVC foam sheet provided under the brand name Komatex™. A panel 90 that is self-supporting, such as a polymer foam sheet would be lightweight, yet rigid enough to allow the use of the fast mounting, releasable fastener clips 92 and clip receivers 94 depicted in FIG. 11b. It is further contemplated that a solid sheet material may be utilized, such as wood, polymer (e.g., polycarbonate or acrylic) sheets, which would provide a suitable front surface, and be self-supporting. The front surface of the panel 90 may be suitable for customization through any suitable technique, including the application of graphics (e.g., screen printing, painting, laminating, vinyl lettering) and texturing or forming to desired shapes. It is contemplated that the front surface of the panel 90 may be any suitable smooth or textured surface, as desired for the particular application.

Figure 3:
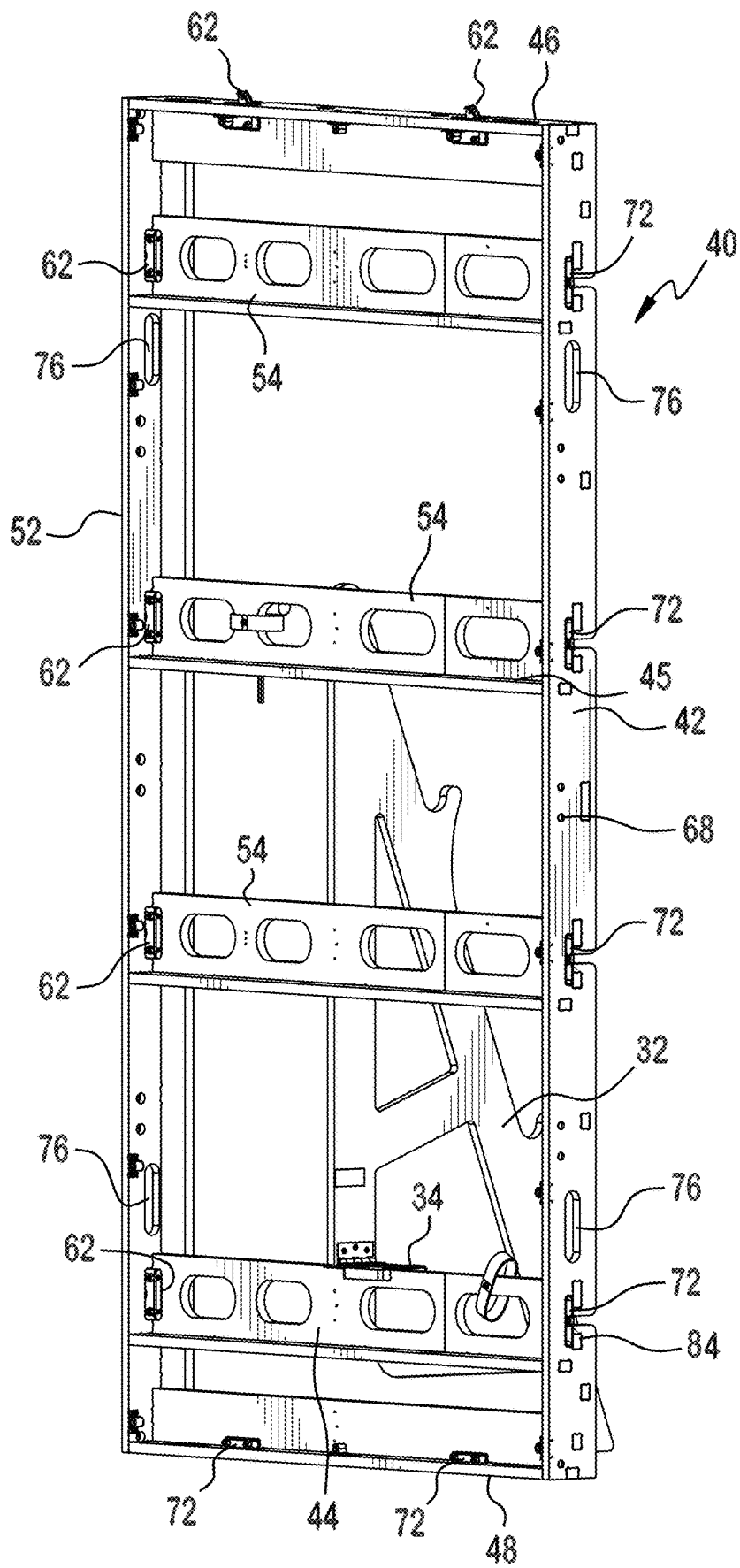
FIG. 3 is a front perspective view of a frame assembly and jack assembly of a modular display panel according to an embodiment of the invention.
Figure 4:
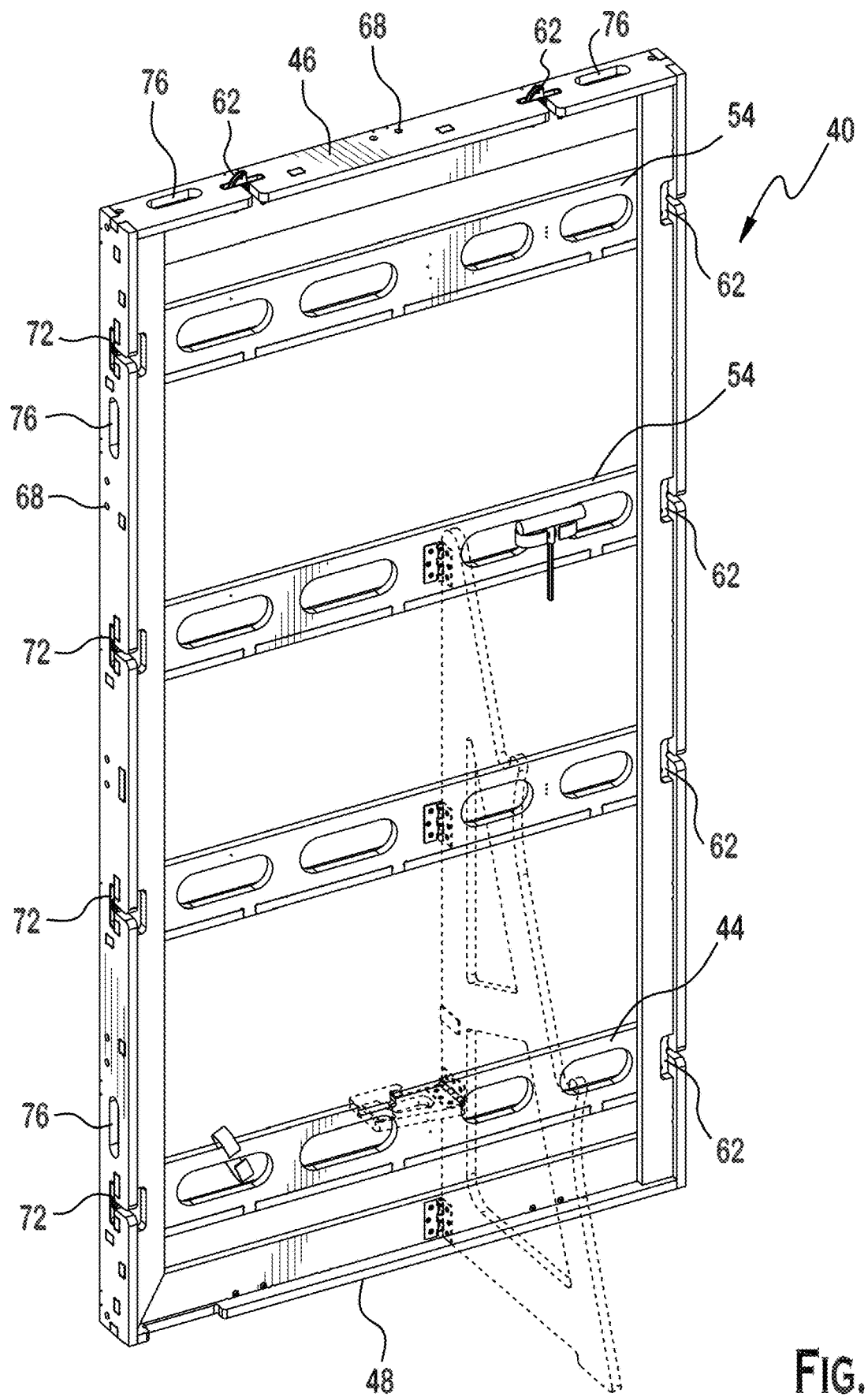
FIG. 4 is a rear perspective view of a frame assembly of a modular display panel according to an embodiment of the invention, with the jack assembly depicted in phantom for ease of viewing the frame assembly components.

The frame assembly 40 can be seen with reference to FIG. 10, depicting the back side perspective view of the modular display panel 10, and also to FIG. 3, depicting the front side perspective view of the modular display panel 10, only with the panel 90 having been removed, to allow visibility of the components that would otherwise be hidden behind the panel 90. FIG. 4 depicts the frame assembly in isolation, with the jack assembly components provided in phantom lines, solely for purpose of ease of view of the positional configuration of the frame assembly 40 and the jack assembly 30. Additionally, with reference to FIG. 13, major components of the frame assembly 40 are depicted in partially exploded form. Side profile views depicting the major planar surfaces of major components of the frame assembly 40 are further depicted with reference to FIGS. 14a-14f. As depicted in FIGS. 10 and 3, the frame assembly 40 is depicted as an assembled form, ready to receive the panel 90 on the front of the frame assembly. As shown, the frame assembly 40 generally provides a rectangular form, having both vertically oriented members and horizontally oriented members. The term vertically oriented and horizontally oriented are used for reference and is referring to the display panel 10 being provided in the orientation depicted in FIGS. 3, 9 and 10, for example, characterized by having the long axis of the panel being arranged vertically, and with the bottom of the jack leg resting against the floor when deployed, as shown in FIG. 10. It is recognized that the display panel 10 may be placed rotated 90 degrees, to have the long side surface now as the bottom edge, and with the long axis of the panel now being generally horizontal, as shown at the top of the modular display system 1 of FIGS. 1 and 2.

The frame assembly 40 includes the following as major components: a bottom plate 48, a top plate 46, first stile 42 and second stile 52, and a plurality of toggles 54, including a bottom toggle 44. As shown in FIG. 10, the bottom plate 48 and a top plate 46 are positioned at opposite sides of the length of the display panel 10, to form the bottom and top edges, respectively, of the display panel 10. Extending between the bottom plate 48 and the top plate 46 and forming the side edges of the display panel 10 are a first stile 42, and second stile 52. At least one toggle 54 is extended across the width of the display panel, between the top and bottom plates, and positioned with the major planar surfaces of the toggle being parallel to the front and back of the display panel 10, secured to and extended perpendicularly between the first and second stiles 42,52, as depicted in FIG. 10. Furthermore, in the embodiment of FIG. 10 there are four toggles 54 provided, including a bottom toggle 44 that is positioned similarly to the other toggles 54, however, the bottom toggle is characterized by being positioned at a height that is near to, and above the bottom plate, and may be below the mid-height of the display panel 10, generally in the bottom quarter of the height of the display panel 10. This bottom toggle 44 is shaped largely similar to the toggle 54, only the bottom toggle 44 further provides a recess 36 configured to receive a locking brace 34, as will be discussed. In an embodiment, each of the major components of the frame assembly 40 discussed above may further be provided with a reinforcing rail having a major planar surface that is arranged perpendicularly to the major planar surface of the major component of the frame assembly 40, and each rail is to have a length axis that is parallel to the length axis of the respective major component of the frame assembly 40 that each rail is to respectively reinforce. By being arranged with the length of the reinforcing rail extending along the length of its respective frame component, and with the width axis that is oriented to be perpendicular to the width axis of the respective frame component each rail is secured alongside, each rail will thus serve to provide additional structural rigidity and strength to the assembled frame assembly 40. In such an embodiment, and as depicted in FIG. 10, and in partially exploded form in FIG. 13, the frame assembly thus further provides: a bottom plate rail 49 that is arranged perpendicular to and along the inside planar surface of the bottom plate 48; a top plate rail 47 that is arranged perpendicular to and along the inside planar surface of the top plate 46; a first stile rail 43 that is arranged perpendicular to and along the inside planar surface of the first stile 42; and a second stile rail 53 that is arranged perpendicular to and along the inside planar surface of the second stile 52; for each toggle 54 of the frame assembly, a toggle rail 45 is arranged along the lower edge of each of the toggles 54, and positioned perpendicular to the major planar surface of each of the toggles 54, including the bottom toggle 44.

Figure 13:
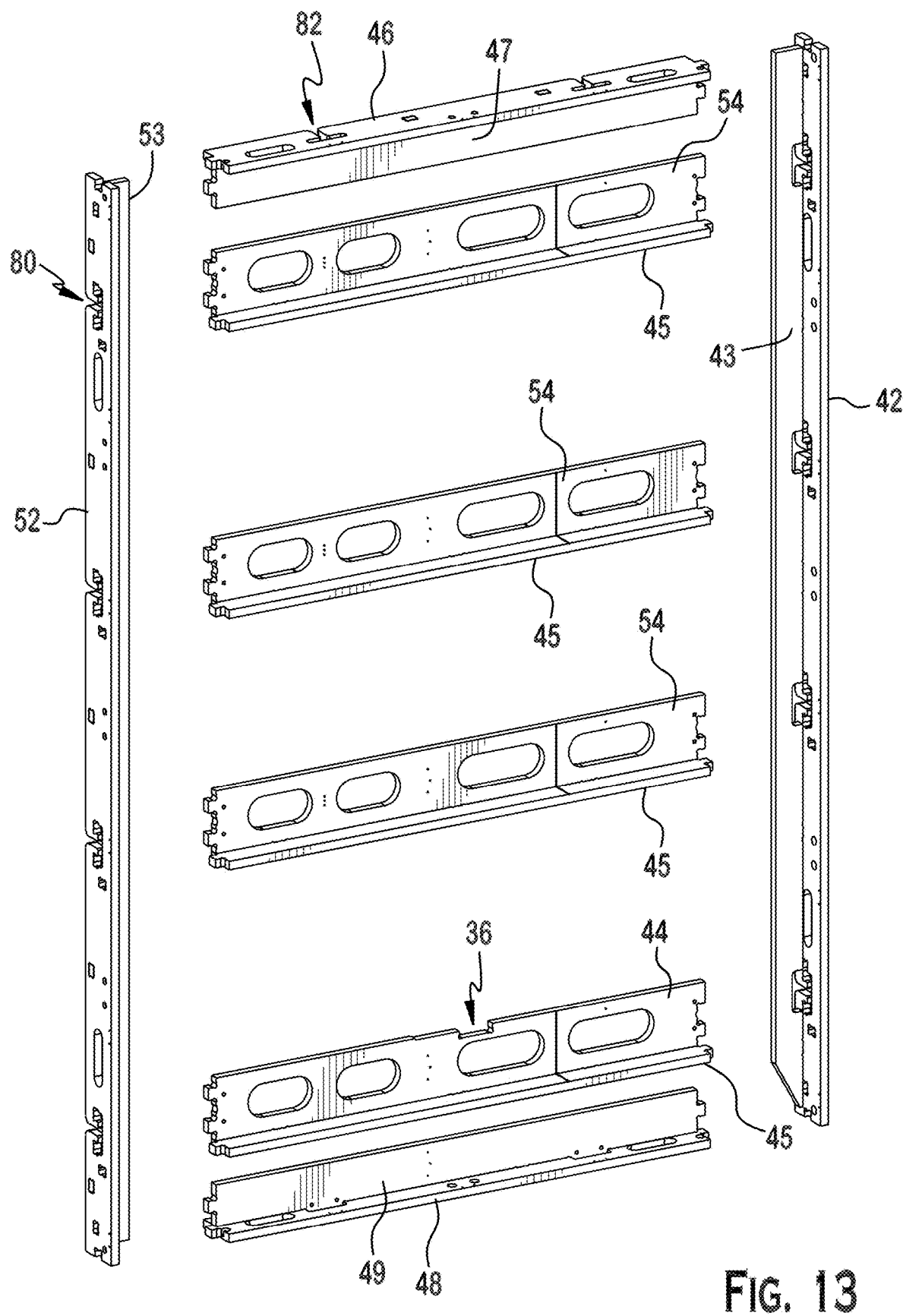
FIG. 13 is a partially exploded, front perspective view of the frame assembly of an exemplary modular display panel according to an embodiment of the invention, shown partially disassembled.

As depicted in FIG. 10, and FIG. 13, the frame assembly 40 is to be constructed using techniques that result in the frame assembly being rigid, and dimensionally true, with the components of the frame assembly being connected through any suitable means, preferably through the use of mortise and tenon configurations that will ensure proper alignment of the components as the frame assembly 40 is secured together. Such mortise and tenon connections may rely solely on friction to retain each tenon within a respective mortise and may further be secured with an optional adhesive to hold the tenon within its mortise, and the adjoining edges of the framing components together. It is further contemplated that optional fasteners (e.g., nails, staples, brads, screws, pins, etc.) may further be provided to hold the mortise and tenon connection together, at least until the adhesive, if any, has set. Exemplary securement of mortise and tenons securing various components can be seen with regards to FIG. 10, for example, where a toggle 54 is to be secured to its respective reinforcing toggle rail 45 by a plurality of tenons protruding down from the long edge of the board of the toggle 54 that are received in respective mortises provided in edge of the reinforcing toggle rail 45. Furthermore, the ends of the toggle 54, and reinforcing toggle rail 45 are received within mortises provided in the respective stile 52, 42. Similarly, the top plate 46 and top plate rail 47, as well as the bottom plate 48 and bottom plate rail 49, each feature tenons at the ends that are to be received within corresponding mortises provided at the top and bottom ends of each stile 52,42, visible in FIGS. 10 and 13. Details of the representative placement and shape of the various mortises used in the frame assembly 40 can be seen with reference to the planar profile views of the major components of the frame assembly depicted in FIGS. 14a-14f Each of the first and second stiles 42,52 can be seen to provide mortises 84, and other multi-functional mortise cavities 80, 82, as will be discussed. It is preferable that the mortises and tenons utilized in the frame assembly 40 should be positioned accurately and precisely on the various components of the frame assembly 40, to ensure that the components of the display panel 10, and within the system 1 are modular, where each component will reliably fit into position, and individual components could easily be substituted with a replacement component, and assembled display panels 10 will reliably fit against an adjoining panel, as will be discussed. Narrow dimensional tolerance in manufacture of the various components of the frame assembly 40, and the display panel 10, will allow the goal of providing modular components and panels 10.

Narrow dimensional tolerance may be achieved by milling the framing components to size, for example through the use of automated milling machines, such as CNC mills to ensure that the components are capable of being replaced with another of the same type of component, and the overall dimensions of the frame assembly will remain dimensionally accurate. In an embodiment, the components of the frame assembly 40 will be machined or milled to proper desired dimensions, and along the part's width, length, and depth, and along the surfaces, to ensure that accurate shape and features are provided, reproducibly for each of the modular pieces. Furthermore, for dimensionally accurate, and strong joinery, the automated milling may beneficially provide mortise cavities and protruding tenons on the components of the frame assembly 40, to ensure that when fully assembled, the frame assembly 40 will be dimensionally accurate, and true, to ensure that the panel 90 can reliably be affixed to the frame assembly 40. Such a resulting modular display panel will be able to be secured to an adjoining display panel 10, for example, through the use of draw latch features as will be discussed, and the resultant boundary between adjoining display panels 10 will provide seams that are difficult to detect by eye when at an anticipated viewing distance, e.g., when the viewer or camera is positioned more than a few feet (e.g. five or more feet) away from the front of the assembled modular display system 1. Furthermore, the CNC milling allows for incorporation of features that reduce overall weight of the assembled frame, such as the openings provided in each of the toggles 54, as depicted in FIG. 10, the inclusion of grip openings 76 around the perimeter of the frame assembly 40, where a user may grasp the frame assembly for ease of transport or moving of the modular display panel 10. Additionally, the milling of the frame assembly 40 components allows for accurate, reproducible mortises that will be capable of serving multiple functions, by creating a single continuous cavity in one or more the components, where the single cavity may provide regions that accommodate different components or serve different functions, as will be discussed. Additionally, the dimensionally accurate milling will be capable of providing tenons that are shaped accurately, and positioned accurately for receipt within the corresponding mortises, as known in traditional mortise and tenon joinery techniques. In an embodiment, every surface of every component of the frame assembly 40 may be milled to ensure that the resulting frame assembly is square, true, and dimensionally accurate, to accommodate the modular replacement of individual components, to ensure the securement of the panel 90, and assembly of multiple panels 10 into a modular display system 1, as shown in FIGS. 1 and 2.

With reference to FIG. 10, the mortises provided may include varying forms. For example, mortise 84 is shown with reference to various components depicted in FIGS. 14a-d. The mortise 84 is provided solely to receive a tenon 184 therein. Representative tenons 184 can be seen, for example, provided on ends of the top plate 46, as shown in FIG. 14c; the ends of the bottom plate 48, as shown in FIG. 14d; and along the bottom edges of the toggles 54, including bottom toggle 44, as shown in FIGS. 14e and 14f In an embodiment, the mortise 84 can be the generally rectangular open mortise 84 having just three walls, for example, as depicted at the top of stile 42, shown in FIG. 14a, or the generally rectangular openings shown in the various examples of mortises 84 provided at interior locations along the length of the stiles 42, 52. Alternatively, mortises may be provided that are multi-functional, but formed from a single cavity of non-rectangular shape, and providing a plurality of regions serving varied purposes.

An alternative form of a mortise is depicted with reference to the top plate 46, having at least one bifunctional mortise 82, as depicted in FIG. 14c. The bifunctional mortise 82 provides a first region 82' and a second region 82" within the shaped cavity. The first region 82' of the bifunctional mortise 82 provides a shaped cavity portion that can accommodate the external shape of a portion of a draw latch therein, as will be discussed. The second region 82" of the bifunctional mortise 82 can serve as the passageway for the key or tool for operating the draw latch, as will be discussed. As depicted, the second region 82" extends to the edge of the top plate 46 and forms an access passageway through which a tool may be directed, in order to manipulate a draw latch provided in the first region 82' of the bifunctional mortise 82, where the tool is directed to pass entirely through the length of the second region 82". The first region 82' is shaped to accommodate the exterior profile of a portion of the draw latch, such that the draw latch will fit snuggly within the bifunctional mortise 82.

Figure 12:
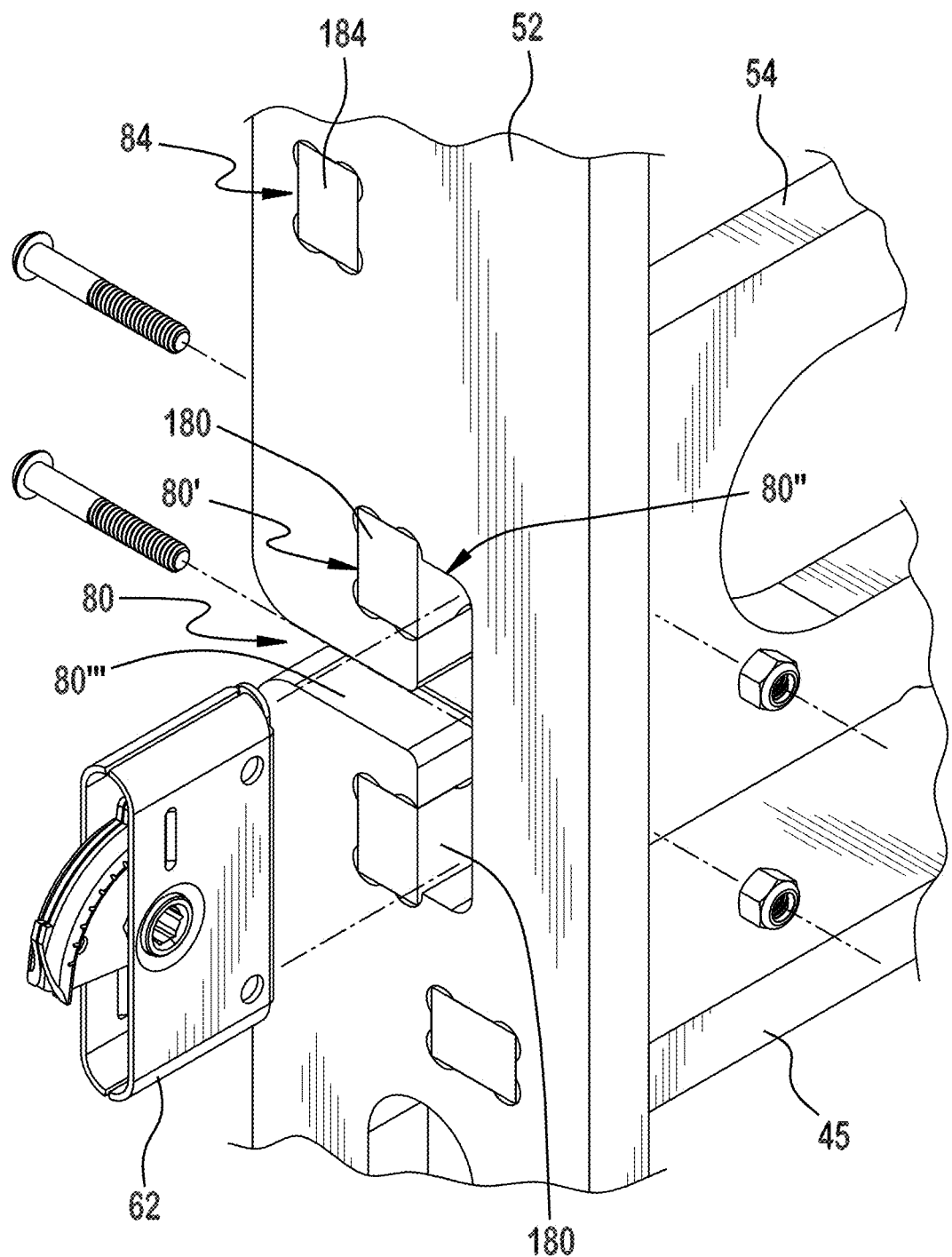
FIG. 12 is an expanded partially exploded, front perspective view of the frame assembly of an exemplary modular display panel, and depicting the detail of the male connector positioned to be inserted into an exemplary trifunctional mortise of second stile, according to an embodiment of the invention.

Still another alternate mortise form is depicted with reference to the first and second stiles 42, 52 having a trifunctional mortise 80, for example, as depicted in FIGS. 14a and 14b, respectively. The trifunctional mortise 80 provides a first region 80', a second region 80", and a third region 80''' within the shaped cavity. Details of an exemplary trifunctional mortise 80 can be seen with reference to FIG. 12. The first region 80' of the trifunctional mortise 80 provides a shaped cavity portion that can accommodate the double tenon of the corresponding toggle 54, thus the first region may be discontinuous. The second region 80" of the trifunctional mortise 80 provides a shaped cavity that can accommodate the external shape of a portion of a draw latch therein, as will be discussed. The third region 80''' of the trifunctional mortise 80 provides a shaped cavity portion that can serve as the passageway for the key or tool for operating the draw latch, as will be discussed. As depicted, the third region 80''', similar to the second region 82" of the bifunctional mortise extends to the edge of the respective stile 42,52 and forms an access passageway through which a tool may be directed, in order to manipulate a draw latch provided in the second region 80" of the trifunctional mortise 80, where the tool is directed to pass entirely through the length of the third region 80'''. The second region 80" is shaped to accommodate the exterior profile of a portion of the draw latch, such that the draw latch will fit snuggly within the trifunctional mortise 80. As shown in FIG. 12, the first region 80' of the trifunctional mortise 80 is discontinuous, and provides a pair of tenon-receiving mortises, where the mortises are initially of an open type having only 3 walls forming the sides, until the point at which the draw latch, whether male or female 62, 72 respectively, is inserted into place in the second region 80" within the stile 52,42, at which point the body of the draw latch will serve to convert the mortises of the first region 80' such that they are no longer open on one side, but rather each tenon would be enclosed on three sides by the stile, and on the fourth side by the body of the respective draw latch inserted into the second region 80".

In an embodiment, two components of the frame assembly 40 may be joined using a double mortise and tenon joint. For example, as can be seen with reference to FIG. 12, an exemplary double mortise and tenon joint is provided where toggle 54 can be seen to have a double tenon 180 provided on each end, and configured to fit into the respective mortise 80 provided in each of the first and second stiles 42, 52. Specifically, as shown in FIG. 12, each of the tenons would fit into the corresponding generally rectangular portions of the first region 80' provided in the cavity of the mortise 80. These tenons would then be secured within the stile 52, 42 by fitting into the rectangular opening defined on 3 sides by the body of the stile 42, 52 and on the remaining side would be defined by the body of the draw latch 62 that is inserted into the second region 80" of the trifunctional mortise 80.

In an embodiment, it is contemplated that there may be a need to ensure that the components of the frame assembly 40 are keyed so as to only fit together in proper orientation, this may be achieved by ensuring the frame assembly can only be assembled with proper directionality of the assembled components. This can be achieved, for example through the technique of providing a bias in the double mortise/tenon connection. Such bias can be seen by comparing the profiles of the trifunctional mortise 80 in the first stile 42, compared to the second stile 52. As shown in FIG. 14a, the second stile 52 provides a trifunctional mortise 80 that has a first region 80' configured to accept a pair of identically shaped tenons on the toggle 54. This can also be seen in greater detail with reference to FIG. 12, where each of the tenons 180 are of the same dimensions. In contrast, and with reference to FIG. 14b, the first stile 42 has the trifunctional mortise 80, where the first region 80' of the second stile is configured to accept the biased form of the double tenon characterized by having unevenly sized double tenons 180', as can be seen on the right side of the toggle 54, in FIG. 14F. By providing tenons of varying sizes on one side of the toggle, and tenons of the same size on the other side of the toggle, the components can only be assembled in one orientation in order to fit within the respective mortises 80 of the first and second stiles 42, 52.

In an embodiment, and as can be seen, for example, with reference to FIG. 12, the inside corner features of one or both of the mortises 80, 82, 84, and the tenons 180, 180', 184 may be milled away slightly, to expand the tolerance allowed when approximating the mortise and tenon features together. In this manner, the planar surfaces of the perimeter of the tenon 180, 180', 184 will be more likely to smoothly slide against the planar surfaces of the inside perimeter of the mortise 80, 82, 84, as the tenon is caused to engage and advance into the respective mortise. It is contemplated that in an embodiment, any of the tenons 180, 180', 184 may optionally be slightly tapered, for example, at less than approximately 5 degrees off of the plane of the mortise feature, in one or both of the horizontal or vertical direction, as may be provided by having the protruding end of the tenon be slightly smaller than the portion of the tenon away from the protruding end, such that the tenon will tend to self-center within the mortise as the tenon is urged further into the mortise, and the rounded or milled away inside corners may serve to prevent the tenon from hanging up as the tenon is advanced into the mortise.

Figure 5A:
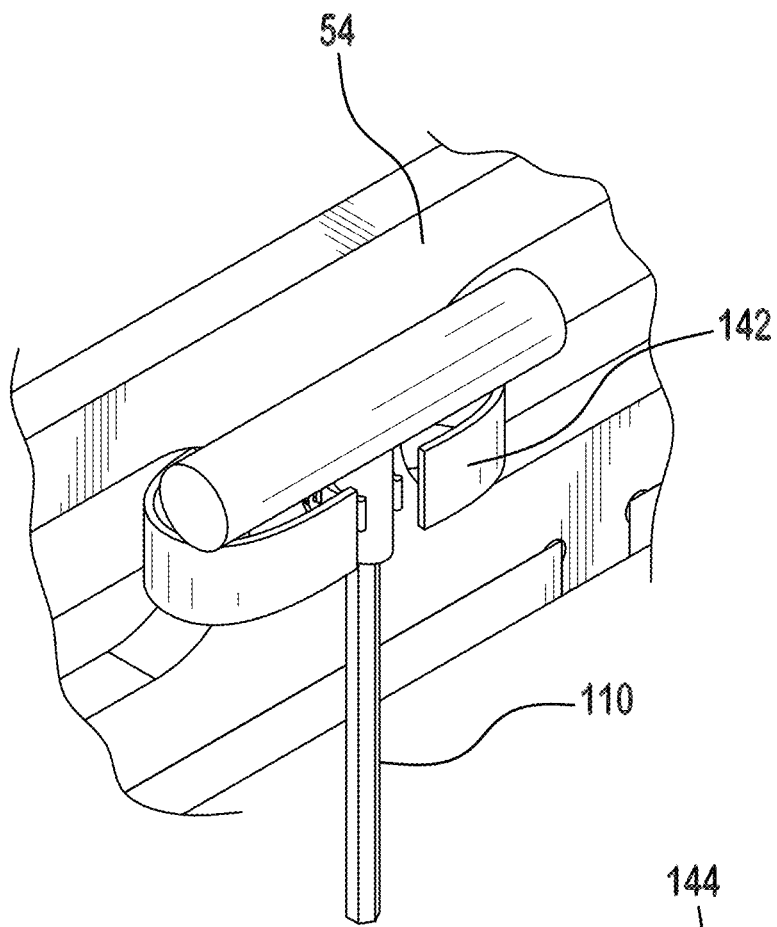
FIG. 5a is an expanded detailed view of a portion of the frame assembly, depicting the key secured to the frame assembly by a first retaining means, according to an embodiment of the invention.
Figure 6:
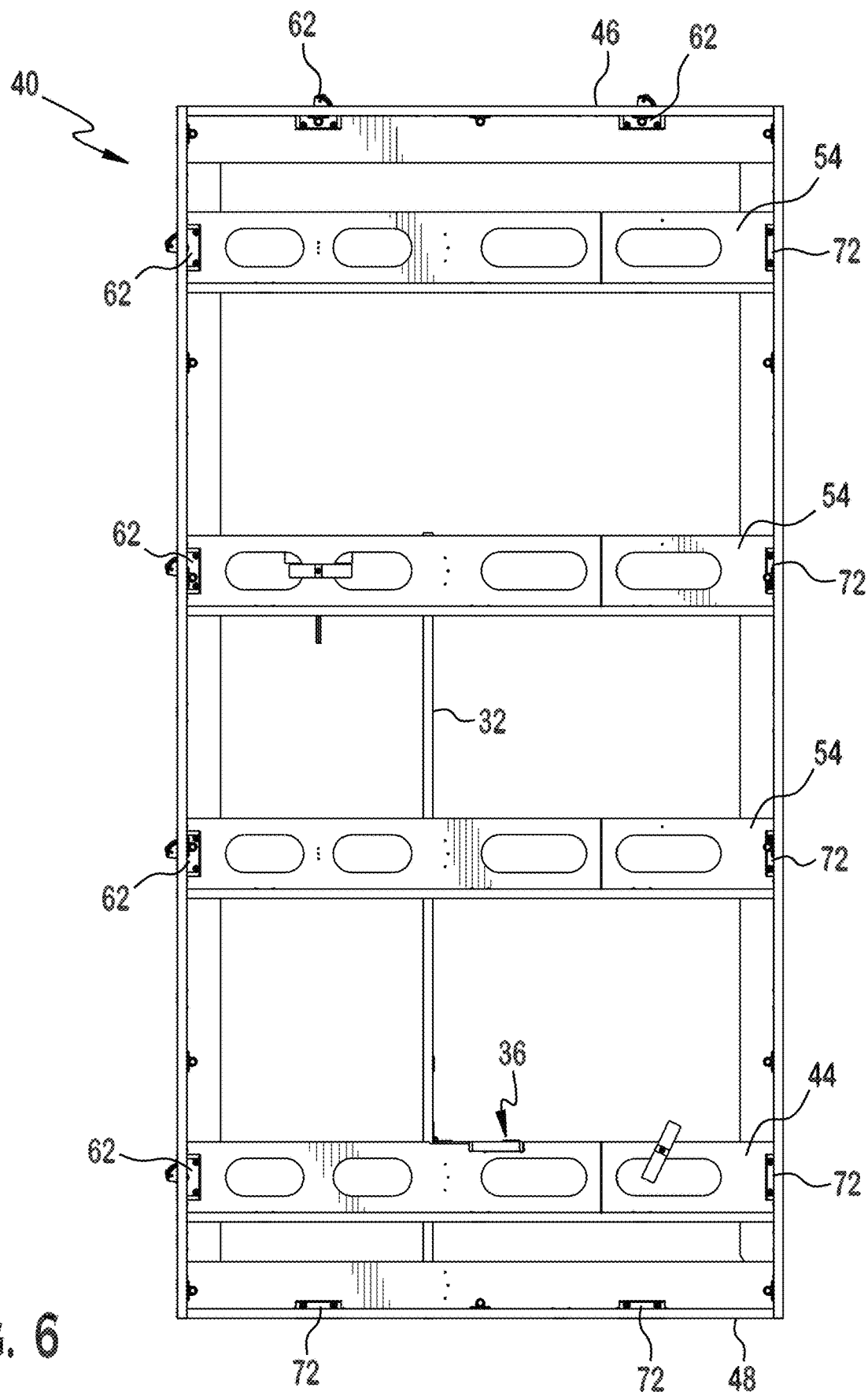
FIG. 6 is a front view of the frame assembly and jack assembly of FIG. 3, according to an exemplary embodiment of the invention.
Figure 8B:
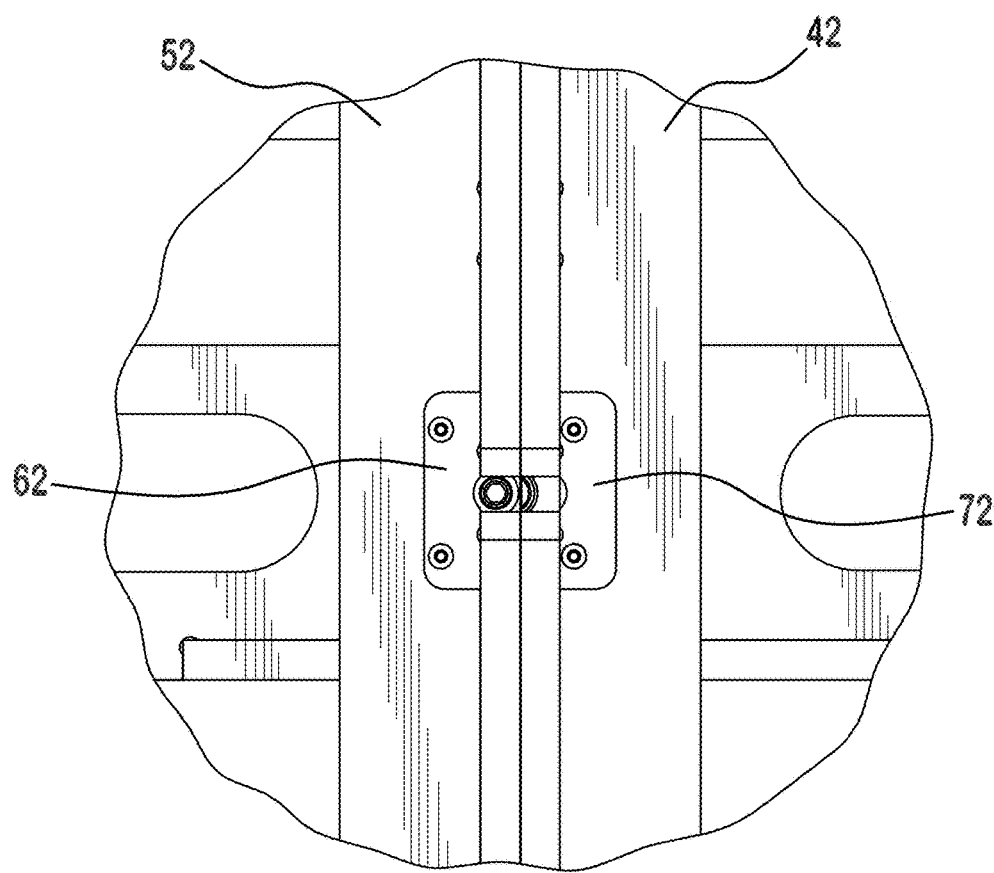
FIG. 8b is an expanded detailed rear view of the edges of the connected display panels of FIG. 8a, showing the male and female connectors having been secured together to provide adjoining panels, according to an embodiment of the invention.
Figure 8A:
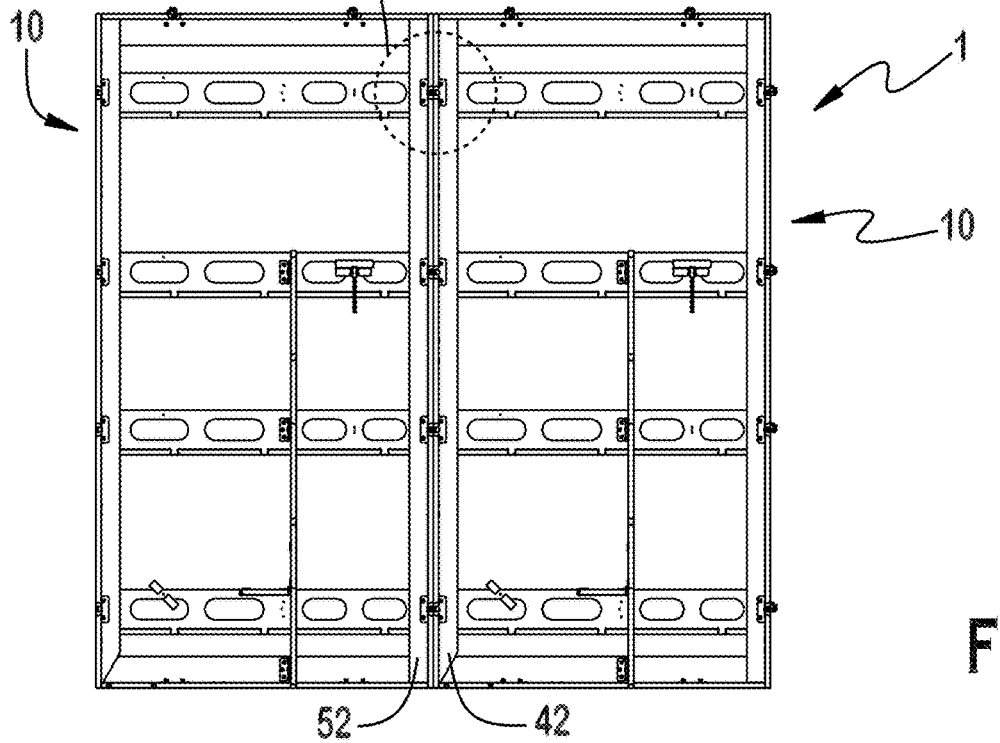
FIG. 8a is rear view of the panels of FIG. 7a, only now having been approximated and secured together to form a modular panel display system by connecting the male and female connectors of the adjoining panels.

In an embodiment, the frame assembly 40 may further be provided with one or more connector mechanisms around the perimeter of the frame assembly. In an embodiment, the connector mechanism may be a blind panel connector, such as a draw latch or coffin lock. As depicted in the Figures, for example with reference to FIGS. 6 and 12, the components of the connector mechanism may be fitted into the appropriate region of a bifunctional mortise 82, specifically the first region 82' of the top plate 46, or bottom plate 48, as appropriate; or for the trifunctional mortise 80, the second region 80" in the respective stile 42, 52. The connector mechanism, once placed into the mortise, may optionally be secured with one or more fasteners, for example, at least one bolt and nut may be provided to hold the connector mechanism in place within the panel. The connector mechanism may operate by joining together a male connector mechanism with a female connector mechanism, such as a hook and pin connector, or alternatively, as shown in FIGS. 6 and 12, a draw latch providing a cam (male) and acceptor (female) arrangement, as shown. The connector mechanism, when actuated, such as by rotation of a key 110 inserted through the key passageway of the mortise 82, 80, and inserted into the keyed recess of the male draw latch 62, and the key or tool rotated, will serve to tightly draw the adjoining modular display panels 10 together and securely lock the panels in place relative to each other. It is contemplated that alternative forms of connector mechanisms may be provided, including any suitable connector mechanism suitable for approximating components together, as known to those skilled in the art. Thus, the use of the connector mechanism, having corresponding male and female components positioned about the perimeter of the frame assembly, will facilitate the securement of the modular display panels 10 in the following manner. Initially, the panels to be secured relative to each other may be placed in proximity to each other, as depicted in FIG. 7a and in detail in FIG. 7b, with the male connector mechanism in an initial, unlocked position. The panels 10 are then pushed together, such that the male connector mechanism begins to partially engage with the female connector mechanism, whereupon the connector mechanism maybe actuated (by rotation of the key) causing the male connector mechanism to rotate to a second locked position, as is known for cam and acceptor connectors, in order to ensure that the adjoining modular display panels 10 are tightly drawn together, and secured in place relative to each other with precision, as depicted in FIG. 8a and in detail in FIG. 8b. The key 110 may then be removed, leaving the panels secured relative to each other. The key 110 may be any suitable tool, such as a screwdriver, or as depicted here, an Allen key, that can be inserted or removed from the male connector and turned to actuate the male connector. When not in use, the key 110 may be stored in a key holder, and optionally secured with a first retainer means 142, for example a tension clip that engages a portion of the key to hold the key when not in use, and/or a releasable securement strap, such as a hook and loop closure, as depicted in FIG. 5a. It is further contemplated that multiple connector mechanisms may be utilized to securely connect a male and female end stud, to affect the joining of two panels.

With reference to FIGS. 1 and 2, the modular display panel system 1 may be provided as a plurality of modular display panels 10 that have been assembled together to form a display surface. The panels 90 for each of the display panels 10 may have the same or different graphics or surface image thereon. In an embodiment, each of the panels may provide a portion of an image or graphic that collectively forms a single image when the multiple display panels are assembled. In another embodiment, each of the panels may have the same image, and collectively the display panels provide a larger image composed of the images on each of the display panels 10. One skilled in the art will recognize that the graphic or pattern provided on the individual panels 90 for each of the modular display panels could be adjusted to provide the desired graphic or pattern for a backdrop.

A representative embodiment of the assembled panels for the modular display system 1 is depicted in FIGS. 1 and 2, comprising a pair of vertically oriented modular display panels 10, with a horizontally oriented display panel 10 arranged on top of the two vertically oriented panels. It is contemplated that alternative configurations of display panels may be desirable, and by varying the number of panels, along with the placement and orientation, it is contemplated that a user may customize the resulting form of the modular display system 1, by assembling multiple modular display panels 10 together as desired. Such varied configurations of the modular display system 1, and the placement and connection of modular display panels 10 to achieve a desired configuration for the system 1 will be understood and familiar to those of skill in the art. For example, a row of upright vertically oriented display panels may be provided. It is also contemplated that multiple panels may be secured relative to each other using the teachings herein and may provide a system 1 utilizing a combination of vertically oriented panels, and horizontally oriented panels 10. It is recognized that the end configuration need not be limited to being a rectilinear shape but can easily be provided as a rectangular graphic surface, as shown in FIG. 1. In order to provide for the varied configurations of the system 1, the modular display panel may provide connection means, such as draw latches as will be discussed, about the perimeter of the frame assembly 40. The placement, and form of draw latch may be adjusted as desired to allow assembly of multiple panels 10 to a desired system 1 configuration. The modular display panel 10 of FIG. 9 provides an exemplary embodiment, and one skilled in the art will recognize that the connection means and placement on the frame assembly 40 may be varied from the particular type and placement of connector means depicted in FIG. 6, in order to allow customization by the end user for a particular purpose, as will be understood by those familiar with the art.

As shown in FIG. 6, the exemplary frame assembly 40 may have connection means in the form of one or more draw latches provided in the first stile 42, and one or more draw latches in the second stile 52. Furthermore, one or more draw latches may be provided along the length of each of the bottom plate 48 and top plate 46. In the depicted embodiment of FIG. 6, four draw latches are provided in the first stile 42, shown here as female draw latch 72. In the depicted embodiment, four corresponding draw latches are provided in the second stile 52, shown here as male draw latch 62. Additionally, two male draw latches 62 are provided for the top plate 46, and two female draw latches 72 are provided for the bottom plate 48. It is contemplated that one skilled in the art may adjust the number and configuration of the draw latches provided in the system 1, in order to accommodate the assembly of the display panels 10 to suit the intended use.

As depicted in FIG. 6, multiple male draw latches 62 are provided in the second stile 52, with correspondingly placed female draw latches 72 in the first stile 42. Additionally, male draw latches 62 are provided in the top plate 46, and correspondingly placed female draw latches 72 in the bottom plate, will allow the assembly of the system 1 with multiple display panels 10 connected together, as depicted in FIGS. 9 and 10. As noted previously, the height of the vertically oriented modular display panel 10 may preferably be twice the width dimension, and the spacing between draw latches for each of the top and bottom plates 46, 48, will align with the placement of the draw latches on the bottom and top halves of the draw latches provided on each of the stiles 42, 52. In this manner, a pair of vertically oriented modular panels that have been connected together along adjoining stiles 52, 42, respectively, will be capable of being connected together with a horizontally placed modular display panel, as depicted in the system 1 of FIGS. 1 and 2. In this embodiment of FIGS. 1 and 2, the horizontally oriented modular display panel 10 is oriented to have the female draw latches 72 of the first stile 42, aligned and connected to each of the male draw latches 62 of the neighboring top plates 46 for each of the vertically oriented adjoining modular display panels 10.

The representative process for connection of male draw latches 62, such as may be provided in the second stile 52, to female draw latches 72 as may be provided in the first stile 42, can be seen with reference to FIGS. 7a, 7b, 8a, 8b, as has been discussed. Similarly, the connection of male draw latches 62 provided in a top plate 46, to a female draw latch 72 provided in a first stile 42 would be performed in the same manner, and requires only adjusting the orientation of the topmost, horizontally oriented modular display panel 10. This connection can be performed as many times as necessary to prepare the modular panels 10 according to a desired arrangement to provide a modular display system 1.

In an embodiment, each modular display panel 10 may optionally connect to other alternative display elements, such as may be accomplished through the utilization of alternative connector forms or fasteners. For example, with reference to FIGS. 11a and 11b, the modular display panel 10 provides around the perimeter of the frame assembly 40 components a plurality of quick release connector receiving holes 68 for releasably connecting alternative display features, such as previously known spinner connectors, which may be secured to the modular display panel through the quick release connector receiving holes 68. For example, a quick release connector may be in the form of a screw configured to pass through of one of the plurality of through holes 68 of the frame assembly 40, and providing a rubber washer, and the screw then engages with a nut. The alternative display element (not shown) may be mounted upon one or more of the nuts. A lever with a cam surface may be positioned, opened (i.e., in a position with the lever arm parallel to the screw) and then used to tighten the screw and the nut together, and then by actuating the cam lever, by pivoting the lever arm to be oriented perpendicular to the screw, will cause the cammed surface of the lever to press against and deform the rubber washer, whereupon the rubber washer is caused to expand laterally to be pressed against the interior surface of the through hole 68. The rubber washer is sized to initially fit in the through hole 68. When the rubber washer is compressed tightly by the placing the cam lever in a closed position (i.e., perpendicular to the screw), the rubber washer extends radially outward, gripping the interior of the through hole 68, and with the alternative panel mounted on the nut, the panel may be secured relative to the frame assembly 40 of the modular display panel 10.

In order to provide the ability of the modular display panel 10, and/or the modular display panel system 1 to be capable of being free standing, a jack assembly 30 may be provided on the back side of the panel. The jack assembly can be seen with reference to FIG. 10, and as deployed for the modular panel system depicted in FIG. 2, where a pair of jack assemblies are deployed, each being provided on adjoining modular display panels 10. The jack assembly 30 comprises at least the following major components: a jack leg 32, and a locking brace 34.

Figure 17A:
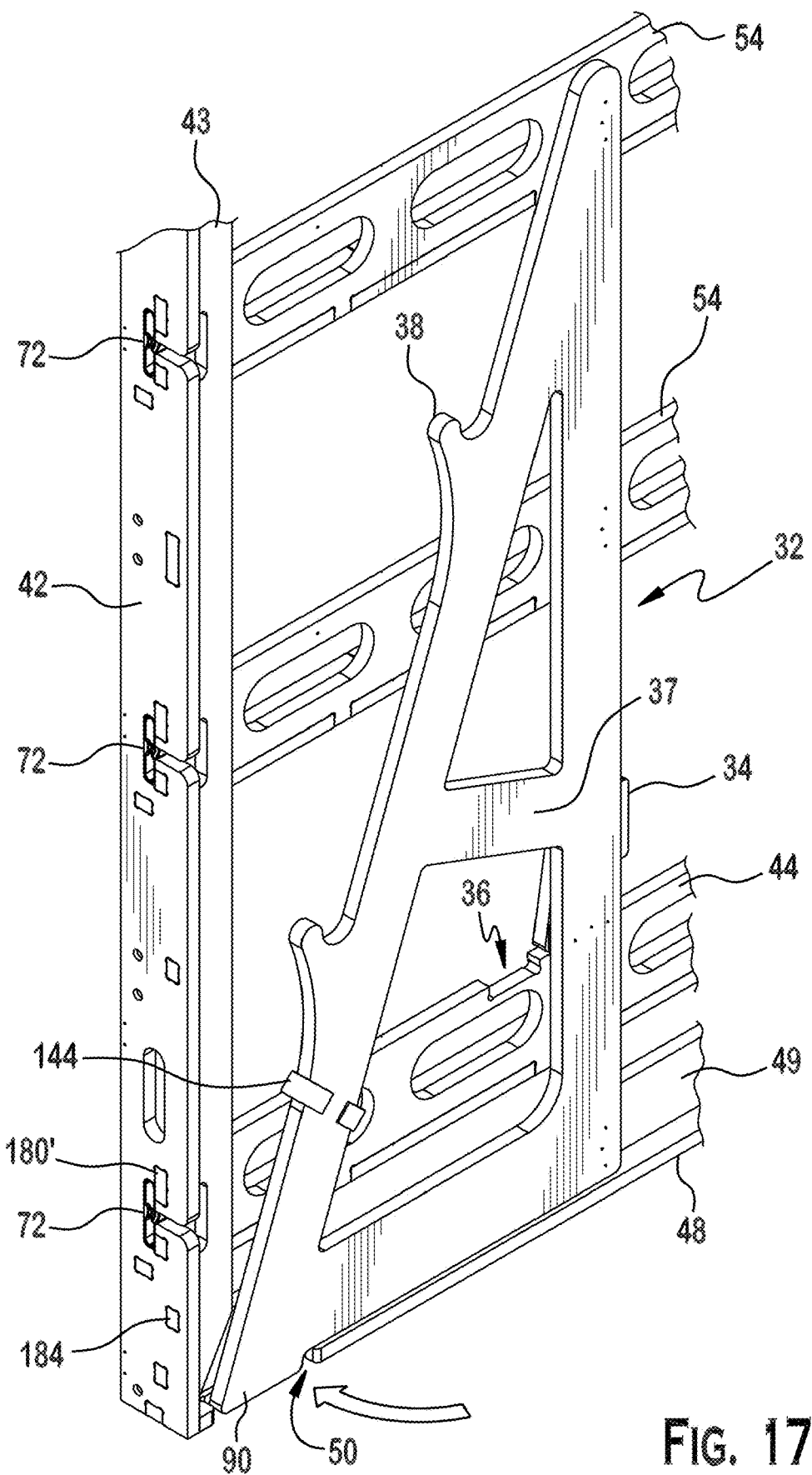
FIG. 17a is a rear perspective view of a portion of an exemplary modular panel display according to an embodiment of the invention, showing the jack assembly with the jack leg provided in a storage and transport position.
Figure 17B:
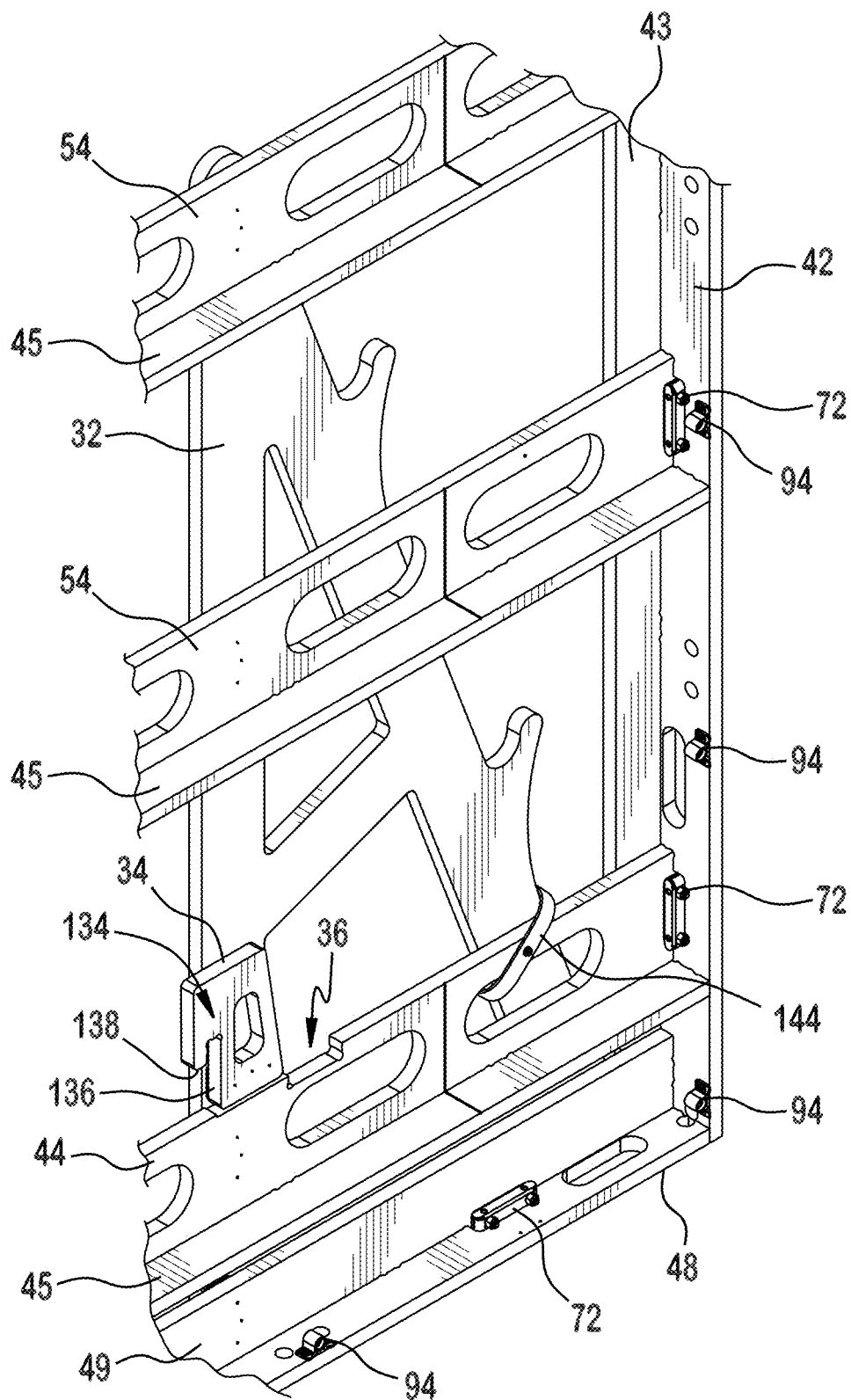

With regards to FIG. 15a, the jack leg 32 may be provided in any suitable form, and in the depicted embodiment has a generally triangular form, having a spine 31, a horizontal rail 33, and a diagonal brace 35. The spine 31 may be provided in a vertical orientation (for a vertically oriented display panels 10) and secured to the frame assembly 40 via one or more hinging units, such that by pivoting the spine about the pivot point of the hinge units, the jack leg 32 will be capable of being rotated between: a first, or deployed orientation, where the jack leg 32 is extended out substantially perpendicular to the panel 90 and extending backwards away from the frame assembly 40 as depicted in FIG. 10; and a second, stowed orientation, where the jack leg 32 is folded to be substantially parallel to the panel 90, and fitting withing the confines of the frame assembly 40, or fitted tightly against the frame assembly 40, as shown in FIGS. 17a and 17b. The jack leg 32 may also have a diagonal rail 37, that extends from a mid-portion of the spine 31 to a mid-portion of the diagonal brace 35, in order to provide additional structural rigidity to the jack leg 32. The jack leg may also be provided with a foot 39, that provides the point of contact between the jack leg and the floor the modular display panel is freestanding on. The foot 39 may be the outermost region of the horizontal rail 33 and may be extended slightly below the rest of the bottom edge of the horizontal rail 33. As can be seen with reference to FIG. 17a, when the jack leg 32 is stowed in the second orientation, the foot 39 may fit within a foot receiving slot 50 provided in the bottom plate (see FIG. 14d). In an embodiment, the bottom of the foot 39 is at a first height, and the bottom of the edge of the rest of the horizontal rail is at a second height, and the difference between the first and second height is equivalent to the thickness of the bottom plate 48. In this embodiment, when the jack leg 32 is stowed, the bottom edge of the horizontal rail will fit within the frame just above the top surface of the bottom plate 48, and the foot 39 will fit within the foot receiving slot 50, such that the bottom edge of the foot 39 will generally align with the bottom surface of the bottom plate 48, as can be seen in FIG. 17a.

In an embodiment, the jack leg 32 may also provide one or more weight receiving features 38, upon which an optional weight, such as a sandbag (not shown) may be hung, suspended, or placed, in order to stabilize the freestanding modular display panel 10 (of FIG. 10), or the modular display panel system 1 (of FIG. 1). In an embodiment, the modular display panel 10 may be capable of free standing without requiring the weight upon the weight receiving features 38, however, by adding weight hanging off of the weight receiving features 38, the center of gravity of the free-standing modular display panel 10 may be shifted further behind the panel 90, and more towards the end of the horizontal rail 33 having the foot 39. This will tend to make the modular display panel 10, and/or the modular display panel system 1 more likely to remain free standing, even if exposed to some wind or externally applied force, by making the modular display panel 10 more resistance to toppling forward. In an embodiment, the weight receiving features 38 are provided as hooks provided on the outside edge of the locking brace. Additionally, it is recognized the weights may be suspended or placed on each of the diagonal rail 37, and horizontal rail 33, in addition to, or as an alternative to the depicted hooks of FIG. 15a. It is recognized that the center of gravity for the modular display panel should be positioned between the modular frame assembly and the foot 39 at the end of the jack leg, and the more the center of gravity is shifted to being closer in alignment with the foot 39 end, the more resistant to toppling forward the modular display panel 10 will be.

Figure 16A:
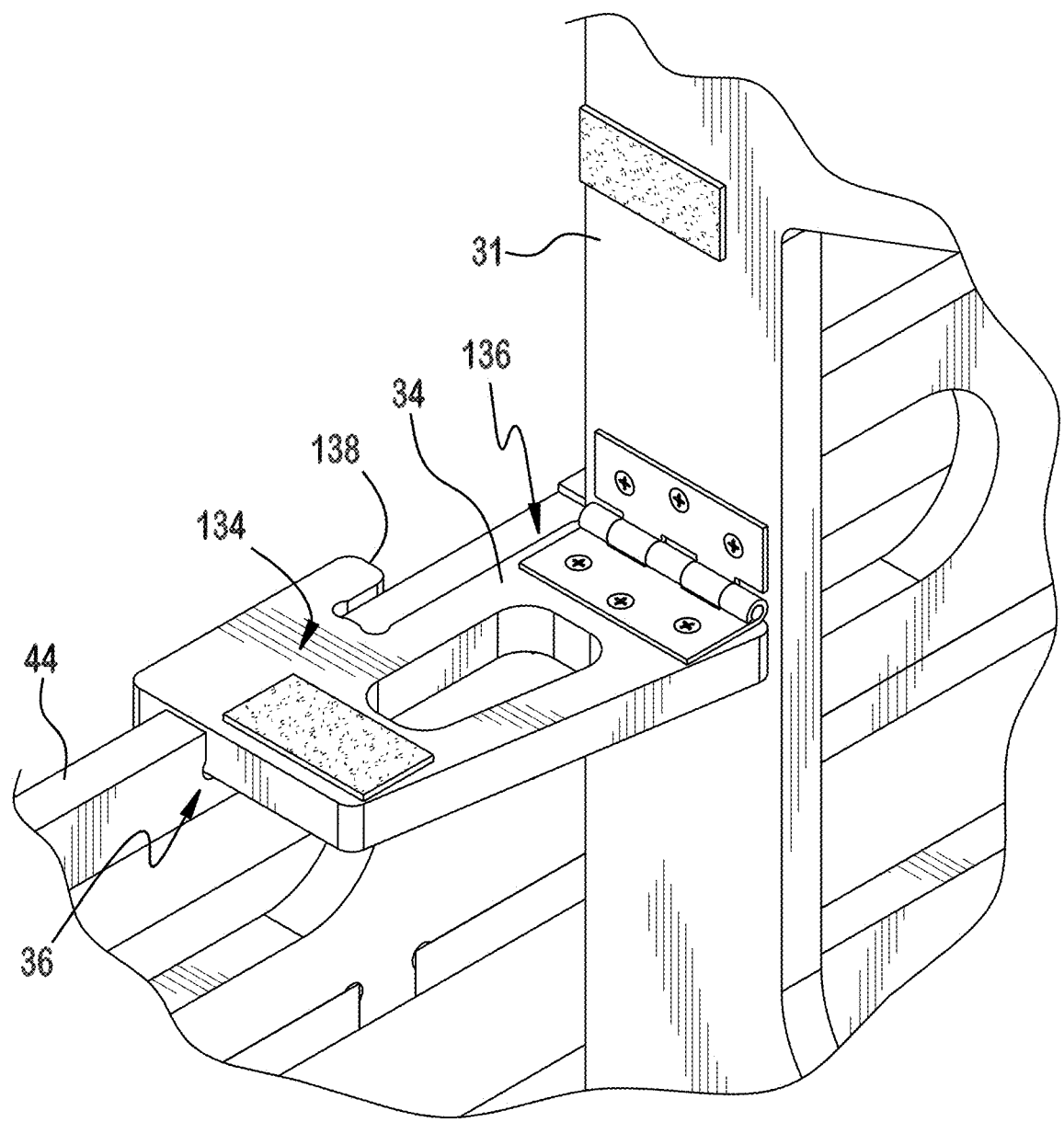
FIG. 16a is an expanded detailed view of the jack assembly and frame assembly of an exemplary modular display panel according to an embodiment of the invention; depicting the locking brace provided in a locking position.
Figure 16B:
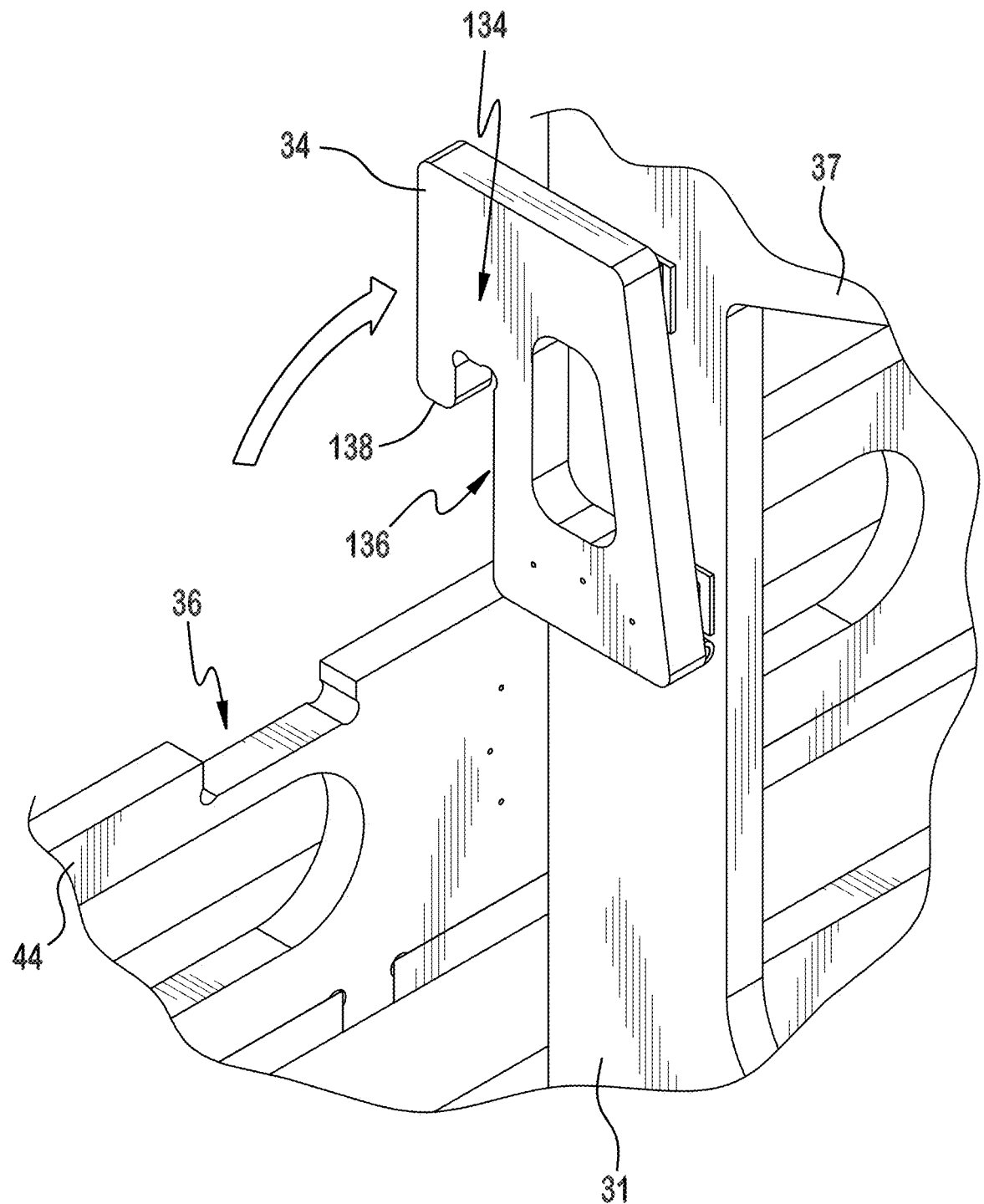
FIG. 16b depicts the jack assembly and frame assembly of FIG. 16a, only with the locking brace pivoted upwards and ready to be placed into the stowed position, according to an embodiment of the invention.

The jack assembly 30 may also comprise a locking brace 34, as depicted in FIG. 15b, and opposing perspective view of FIG. 15c. The locking brace 34 may be pivotably mounted through the use of a hinge, to the spine 31 of the jack leg 32, as can be seen with reference to FIGS. 16a and 16b. The locking brace 34 is configured to rotate between a first position (depicted in FIG. 16a) and a second position (depicted in FIG. 16b), by pivoting about the hinge of the locking brace. In the first position, the locking brace is oriented generally horizontally, as depicted in FIG. 10 and in detail view in FIG. 16a. The locking brace 34 when in a first position will lock the jack leg 32, by having the engagement portion 134 of the locking brace 34 fitting into a locking brace receiving slot, depicted as recess 36, provided on the top edge of the bottom toggle 44 (FIG. 14e). While the engagement portion 134 of the locking brace 34 is residing within the recess 36 of the bottom toggle 44, the locking brace 34 will be resting within a first edge surface 136 of the locking brace resting against the backside of the bottom toggle, and the inside edge of the hook end 138 of the locking brace will be resting against the frontside of the bottom toggle, thereby preventing any movement of the locking brace, and maintaining the jack leg 32 in a deployed position, as depicted in FIG. 10. With reference to FIG. 16*b*, the locking brace 34 may be rotated upwards, pivoting about a hinge pivot to place the locking brace in a second, stowed position, where the locking brace is lifted clear of the recess 36 of the bottom toggle and folded to have the major planar surface of the locking brace resting against the spine 31 of the jack leg 32. The spine 31 may be provided with a retaining means, such as a clasp, or the hook and loop system depicted in the FIG. 16*a*, with either the hook or loop portion provided on the spine 31 and aligned in a position to receive the corresponding hook or loop portion provided on the top side surface of the locking brace 34, such that when the locking brace is folded upwards, it will be retained in the upright, second position, retained against the spine 31, until such time as the user undoes the retaining means, releasing the clasp or separating the hook and loop fasteners, and the locking brace may the return to the deployed first position.

The locking brace 34 may be milled to shape to provide a dimensionally accurate component and may further be milled to include an opening 140, that will serve to reduce overall weight of the modular display panel 10. In an embodiment, and as can be seen, for example, with reference to FIG. 16*b*, the inside corner features of one or both of the hook end 138 of the locking brace 34, and the inside corners of the recess 36 that receives the locking brace may be milled away slightly, to expand the tolerance allowed when approximating the locking brace 34 into the receiving slot provided as recess 36 of the bottom toggle. In this manner, the planar surfaces of the perimeter of the locking brace will be more likely to smoothly slide against the planar surfaces of the bottom toggle, and the inside perimeter of the receiver slot provided as recess 36, as the locking brace engagement portion 134 is caused to advance and engage within the recess 36.

Figure 5B:
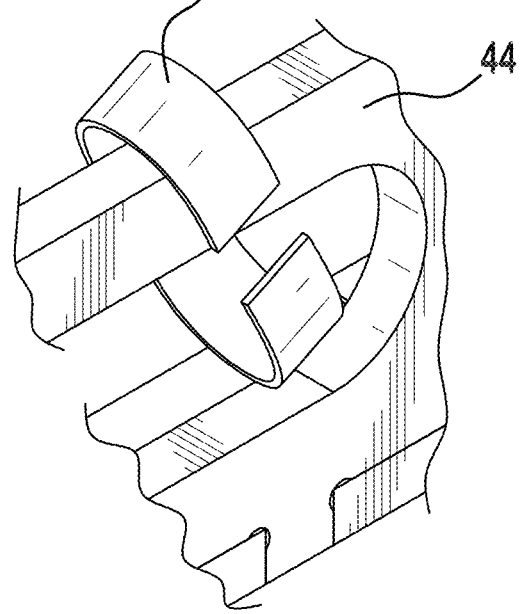
FIG. 5b is an expanded detailed view of a portion of the frame assembly, depicting the second retaining means secured to the bottom toggle and positioned to receive a portion of the jack leg therein.

While the locking brace is retained in the second position against the spine 31 of the jack leg 32, the jack leg may be pivoted to the second, stowed position, as depicted in FIG. 17*a*. A second retainer means 144, depicted in FIG. 5*b* as a hook and loop retaining strip may be secured around and/or to the bottom toggle, and directed around a portion of the jack leg 32 as shown in FIG. 17*a*, and also around a portion of the frame assembly 40 (see FIG. 17*b*), to prevent the jack leg 32 from freely swinging out away from the stowed position. Such a second retainer means may alternatively be one or more of a rope or twine tied around the components, or releasable fasteners, clasp, or tension clips, such as the clips 92 and clip receivers 94 that were previously discussed with regards to releasably securing the panel 90 to the frame assembly 40.

FIG. 17*b* depicts the front side perspective view of the frame assembly 40 with the panel 90 removed to show the jack leg 32 retained in the second position, and showing the retaining means that is secured to, and directed through an opening in the bottom toggle, and holding the jack leg flat within the frame assembly, such as may be beneficial for transport or storage. While the jack leg 32 is in this position, the locking brace 34 is folded upwards as shown, and is generally in planar alignment with the bottom toggle 44, allowing for compact storage of the modular display panel, as there is no portion of the jack assembly that extends outside of the overall dimensions (e.g., maximum width, height, depth) of the frame assembly 40. For storage and transport of the modular display panel 10, the panel 90 may be removed from the frame assembly and stored separately, in order to prevent damage to the panel. Alternatively, it is recognized that the panel, may be stored while secured to the frame assembly, as the panel will not add significantly to the dimensions of the frame assembly 40.

The frame assembly 40, as well as the jack assembly 30, may be made from any suitable structural material, such as wood, though it is contemplated that one could alternatively provide structural components for the frame assembly of any of polymer, composites (e.g., wood fiber-polymer composite, carbon fiber, fiberglass, etc.) and metal (e.g., aluminum), whether alone or in combination with another material.

Figure 18:
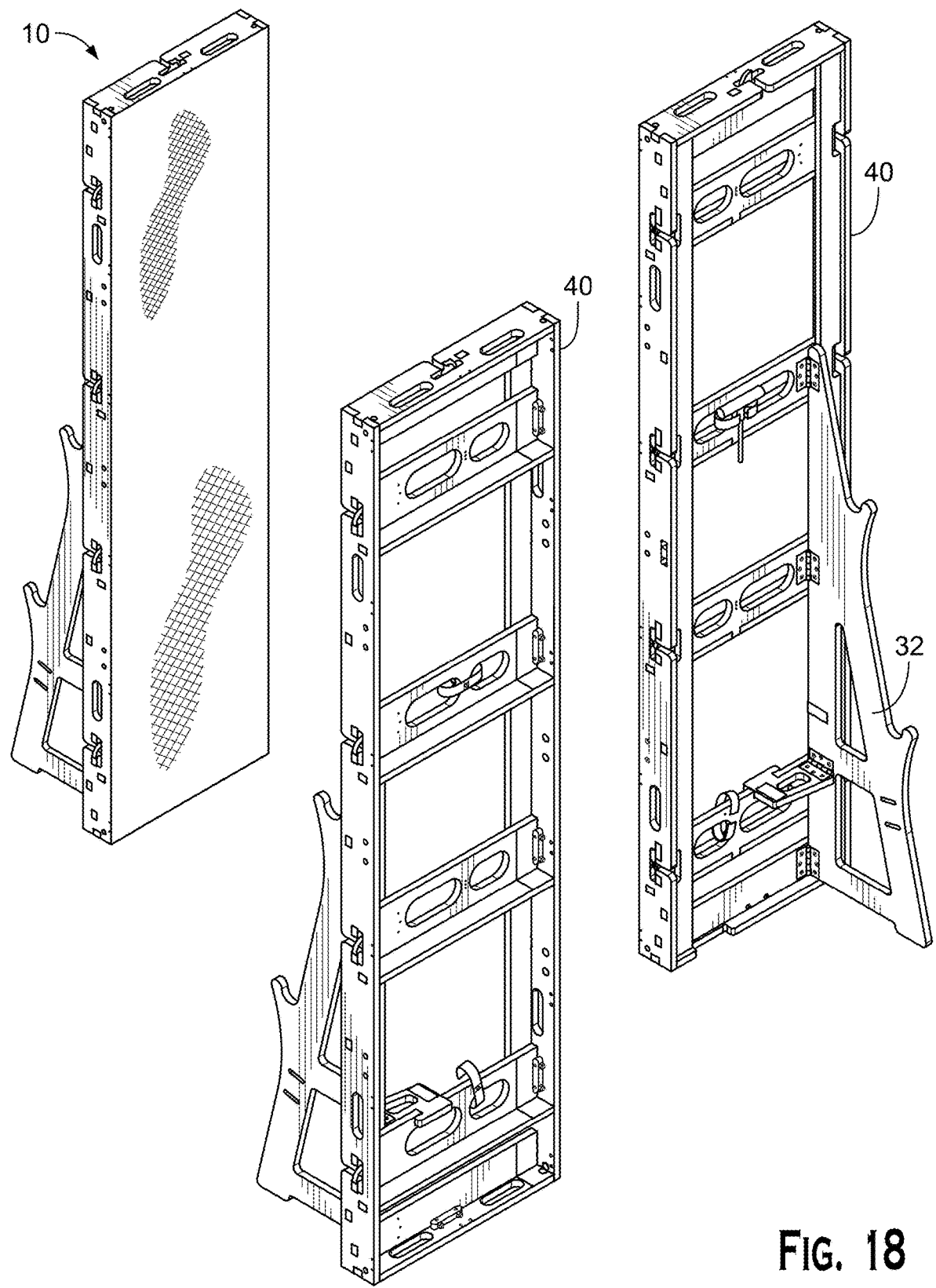
FIG. 18 provides different views of another exemplary embodiment of a modular display panel and components according to an embodiment of the invention.
Figure 19:
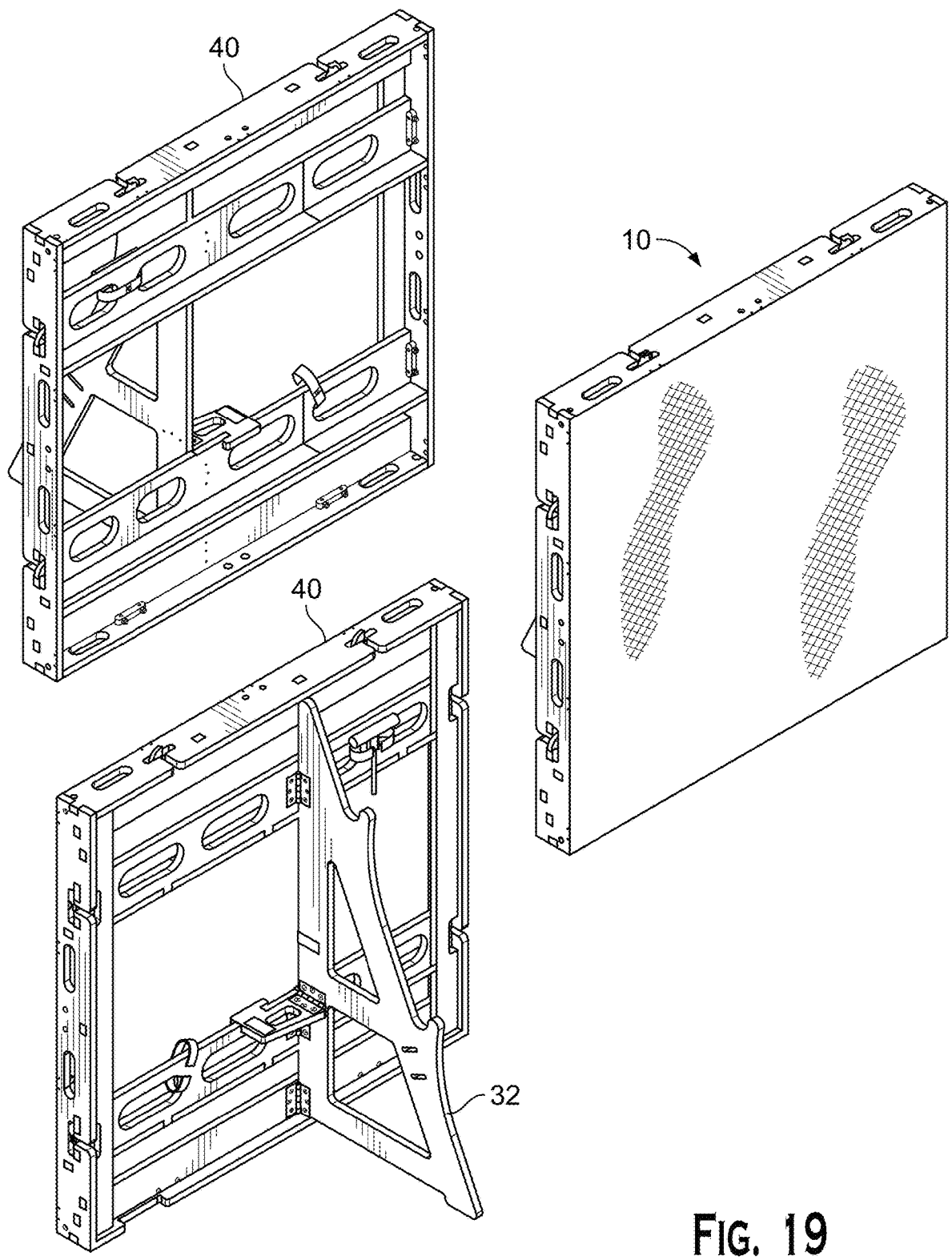
FIG. 19 provides different views of still another exemplary embodiment of a modular display panel and components according to an embodiment of the invention.

Alternative representative embodiments of modular display panels 10 having alternative dimensions can be seen with reference to FIGS. 18 and 19. As with the previously described panels 10 of FIGS. 9 and 10, the panels of FIGS. 18 and 19 may be described having a vertical orientation characterized by being in the orientation where the longer axis of dimension is vertical (the first orientation), and having the jack leg configured to maintain the panel in an upright, free-standing position, as shown. It is contemplated that the modular display panels 10 may optionally be oriented on their side, by having been rotated 90 degrees, such that the long axis of the panel is now horizontally extended. When oriented horizontally, the jack assembly will not be available to ensure that the panel remains upright, and instead such an oriented panel may be secured to the top of free standing panels, similar to the embodiment of the system 1 depicted in FIGS. 1 and 2. These alternative embodiments of modular display panels 10 may incorporate some or all of the teachings herein for the components for each of the frame assembly 40, jack assembly 30, and panel 90, only with adjustments made for the desired size, for example by adjusting the dimensions and/or number of the components that are assembled together having been adjusted to provide an alternative modular display panel that can be of any desired size. The panels 90 provided for the front face for the alternative embodiments of the modular display panels 10, for example, as depicted in FIGS. 18 and 19, will also be adjusted to accommodate the different dimensions, and as taught above, may be connected through the placement of a suitable number of connectors positioned about the panel to be received in corresponding receivers provided on the frame assembly, in order to secure the panel 90 to the frame assembly 40. The different sizes of the modular display panels taught herein will allow flexibility in the dimensions of the modular display system 1 that can be assembled comprising a plurality of any of the modular display panels 10 described herein.

With reference to FIG. 18, an alternative modular display panel 10 is depicted that may have a height or vertical dimension that is the same as the height of the modular display panel depicted in FIGS. 9 and 10, however the width dimension of the panel depicted in FIG. 18 may be less than that of FIG. 9, for example, by being half the width in a horizontal dimension, of the width of the embodiment depicted in FIGS. 9 and 10. The vertically oriented components (e.g. first stile 42, second stile 52) of the frame assembly 40 remain unchanged from those described above, while the dimensions of the horizontally oriented components (e.g. top plate 46, bottom plate 48, toggle 54 of the frame assembly 40 are shortened to provide the panel with a narrow width. Similarly, the dimensions of the jack leg 32 may be adjusted, so as to ensure that the jack leg when in the stowed position, will not protrude beyond the outside dimensions of the frame assembly it is pivotably connected to. As with previously described modular display panels 10, the frame assembly 40 may utilize one or more of the trifunctional mortises 80 provided in the stiles 42, 52, characterized by having 3 distinct regions of the trifunctional mortise 80, with a first region that serves to receive the tenons of another structural component of the frame assembly therein, a second region that serves to receive the connector therein, and a third region that serves to provide a key passageway to allow a tool or key to pass through and facilitate operation of the connector to lock or unlock the panel to another component. Additionally, the top and/or bottom plate 46,48 may have the bifunctional mortise with a region that serves to receive the connector therein, and a second region that serves to provide a key passageway, as described previously.

Similarly, and with reference to FIG. 19, another alternative modular display panel 10 is depicted, only with this embodiment having a width dimension that is the same as the width of the modular display panel depicted in FIGS. 9 and 10, however the height dimension of the panel depicted in FIG. 19 is half the height of that depicted in FIGS. 9 and 10. As shown, the horizontally oriented components (e.g. top plate, bottom plate, and toggle) of the frame assembly remain unchanged from that of FIGS. 9 and 10, while the dimensions of the vertically oriented components (e.g., first stile, second stile) have been shorted to provide the panel with the shorter height. Similarly, the dimensions of the jack leg 32 are adjusted as shown, so as to ensure that the jack leg is of a dimension that will not exceed the height of the frame assembly. As with previously described modular display panels 10, the frame assembly 40 may utilize the trifunctional mortise 80 provided in the stiles 42, 52 with 3 distinct regions of the trifunctional mortise 80 to receive the tenons of another structural component of the frame assembly therein, to receive the connector therein, and to provide a key passageway to allow operation of the connector. Additionally, the top and/or bottom plate 46,48 may have the bifunctional mortise to receive the connector therein, and provide a key passageway, as described previously. In the embodiment of the modular display panel 10 of FIG. 19, there will be no effect in the dimension, were the panel to be rotated 90 degrees from the vertical orientation to the horizontal orientation, though necessarily the jack assembly would only provide the panel 10 to be free standing when in the vertical orientation, and if placed into the horizontal orientation, the jack assembly may be kept in the stowed position, so as to not protrude outside of the dimensions of the frame assembly of the embodiment of the modular display panel. Additionally, the rotation of this or other modular display panels will affect how the panel can be joined to neighboring panels, as the placement of male or female connectors about the perimeter of the frame assembly may only connect in one orientation to other surrounding panels. It is contemplated that the panel may beneficially be rotated in order to be secured to another neighboring panel, if the connections between the securement means will work in one orientation, and not the other. It is also contemplated that one may remove the connector from one edge and replace with another connector that is appropriate, as the connectors are fitted within the respective mortise region, and secured using techniques familiar to those of skill in the art, for example, through the use of one or more fasteners, such as screws, bolts and/or nuts, as non-limiting examples.

Figure 20:
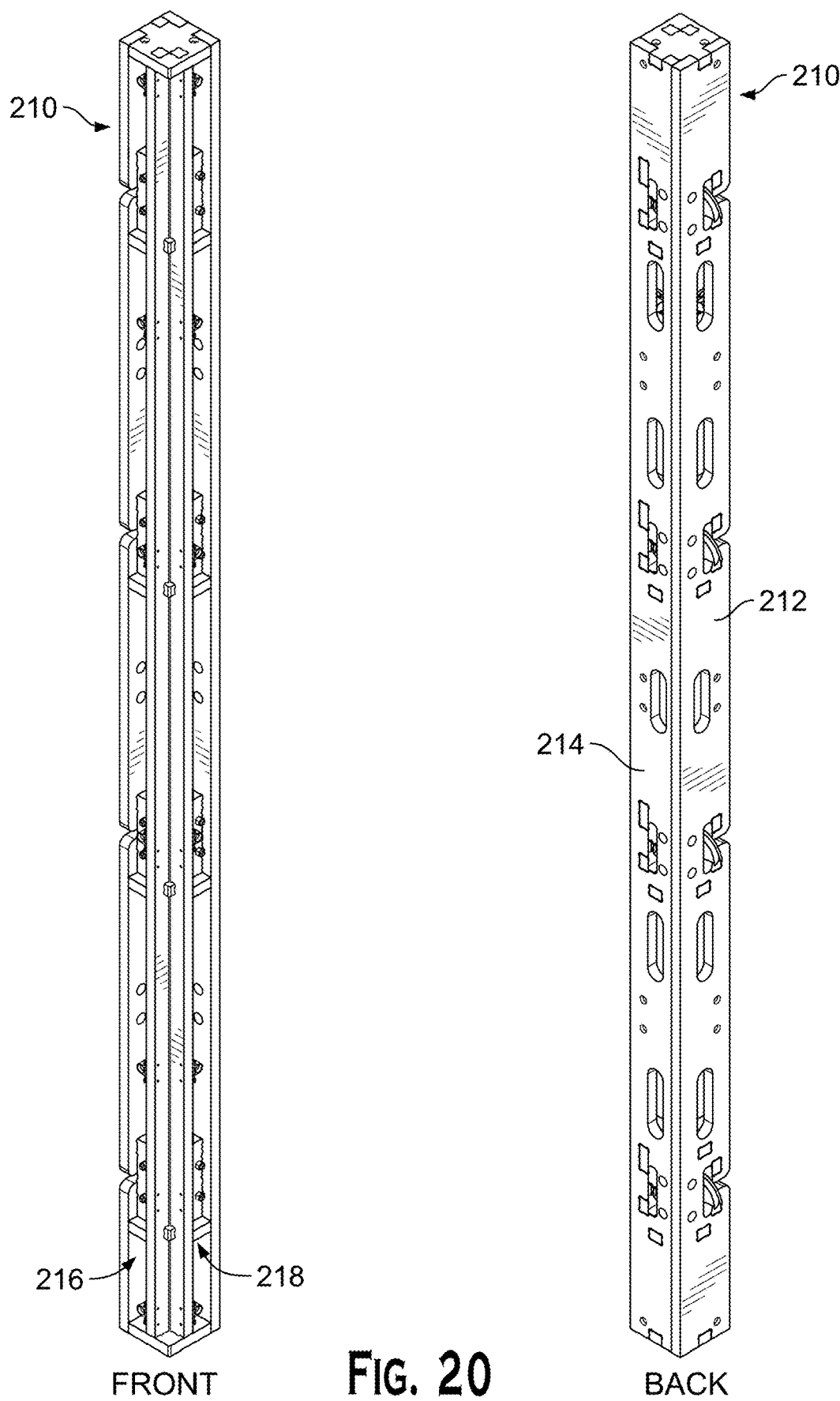
FIG. 20 provides front and back perspective views of an exemplary embodiment of a corner connector for use in a non-planar display system, according to an embodiment of the invention.

In the embodiment of the modular display system 1 depicted in FIGS. 1 and 2, the system is provided having a generally planar display surface from the assembled modular display panels 10, providing a plurality of panels 90 that all are within the same plane and are parallel to each other. It is contemplated that the system in an alternative embodiment, the system 1 need not be limited to being substantially planar. For example, in an embodiment, the display surface for a system may be provided in multiple planes, such as may be achieved through the use of one or more corner connectors. Exemplary corner connectors are depicted in FIGS. 20 and 21 in front and back perspective views. The corner connectors may be provided to secure a modular display panel 10 (as shown in FIGS. 9 and 10) arranged along one plane, with another modular display panel 10 that is arranged in another plane.

With reference to FIG. 21, the corner connector 210 is provided for connecting the long edges of the frame assemblies 40 of modular display panels 10. For example, where the panels 10 are oriented vertically, the corner connector 210 may be provided with a first face 212 having one or more connectors (e.g., male connectors), that can be secured to the first stile 42 of the first modular display panel 10, and the corner connector 210 is then secured with a second face 214 having one or more connectors (e.g., female connectors) connected to the second stile 52 of the second modular display panel 10. As depicted in FIG. 20, the first and second faces 212, 214 of the corner connector 210 are oriented perpendicular to each other, thus creating a 90-degree corner in the system when the corner connector is secured to a pair of modular display panels. Where the corner connector 210 is to be positioned within the assembled system 1, forming the outside of the corner, characterized by having the non-connected surfaces of the corner connector visible, it is contemplated that each of the third face 216 and fourth face 218 of the corner connector 210, that are provided on surfaces opposite from the first and second faces 212, 214, respectively, may be covered with an optional panel 90, for example, utilizing the quick release mounting clips 92 and receivers 94, or any other suitable connection technique, in order to provide a uniform display surface over the entirety of the system, including the corner connector. As can be seen in FIG. 20, the corner connector is provided as a generally rectangular prism shape, though it is contemplated that the shape need not be limited to being rectangular prism in order to allow any suitable angle of connection using a corner connector positioned between and secured to neighboring display panels. The angle formed by the corner connector will ultimately be determined by the difference in angle of each of the planar surfaces of the first face 212 (e.g., having one or more male connectors) and the second face 214 (e.g., having one or more female connectors), where each is connected to a complementary stile (having male or female connectors as appropriate) of an adjoining display panel 10, each located on either side of the corner connector. Thus, it is recognized that in another exemplary embodiment, not shown, the corner connector may alternatively be provided as a triangular prism shape having a first face with one or more male connectors; a second face with one or more female connectors, and a third face that can receive a panel 90 thereon, as has been described previously. The desired angles for the first and second face may be set by the user and will determine the appropriate dimensions of the triangular prism, with the third face completing the triangular prism.

It is also contemplated that the corner connector 210 may be provided to form an inside corner of the display system, where the entirety of the corner connector 210, as it is depicted in FIG. 20, would be hidden behind the panels of the display panels 10 that are to be connected with the corner connector, as the edges of the neighboring panels would abut against each other to form a uniform seam extending along the inside corner for the display surface of the system 1. Should the neighboring panels be configured such that the wrong connector type is provided on the faces of the corner connector, e.g., the first face 212 has the wrong connectors, it is contemplated that the corner connector may be flipped end to end in vertical direction, such that the appropriate connector type would now be positioned properly for securing the neighboring panels together using the corner connector 210, or alternatively, the connectors may be replaced with the appropriate connector type, as discussed above.

The corner connector 210 of FIG. 20 may utilize the trifunctional mortise as has been previously described, and may optionally provide grip openings 76 for handles, and quick release connector receiving holes 68. Alternatively, the connector 210 may provide an alternative bifunctional mortise as depicted in FIG. 20, on the first face 212, characterized by having a first region for receiving the tenons of a component of the corner connector, and a second region for the connector. The dimensions of the corner connector 210 may be of any suitable height, generally corresponding to the height of the modular display panels 10 that are to be joined. The width and length of the corner connector 210 should correspond to the depth of the frame assembly 40 of the display panel that the corner connector is to be secured to. In an embodiment, the width and length of the corner connector are the same, and each correspond to the depth of the frame assembly depicted in FIGS. 9 and 10. In an exemplary embodiment, the corner connector is dimensioned to have a height of 90 inches, and a width and length each of 4 inches.

In another embodiment, the corner connector may be utilized to connect a pair of panels that are provided in a horizontal orientation. Accordingly, with reference to FIG. 21, a half-height corner connector 260 is provided that is generally similar to the corner connector 210 described previously, but with some distinctions, with the most evident distinction being that the height of the half height corner connector 260 corresponds to the width dimension of the panels depicted in FIGS. 9 and 10. As has been described, the panel 10 may be of a width that is half the height, thus the connector 260 of FIG. 21 would be half the height of the connector 210. The half-height connector 260 may be used to connect a pair of horizontally oriented panels, whether in an inside corner configuration, or in an outside corner configuration, as has been described with reference to FIG. 20. The half-height connector 260 may feature the panel 90, secured to receivers 94 provided on the third face 266 and fourth face 268 of the half-height connector 260. The first face 262 and second face 264 may be provided with one or more connectors provided in mortises. In an embodiment, one or both of the first face and/or second face of the connector 260 may utilize a tri-functional mortise as has been described previously. Alternatively, the connector 260 may provide an alternative bifunctional mortise as depicted in FIG. 21, having a first region for the tenons, and a second region for the connector. If necessary, the half-height connector 260 may be flipped vertically to reverse the orientation of the first and second faces 262, 264, in order to provide the proper configuration of connectors to secure neighboring panels together and forming a corner through the corner connector 260. It is further contemplated that a pair of half-height connectors 260 may be stacked vertically in order to perform similarly to the connector 210, described previously. Optionally, grip openings 76 and quick release connector receiving holes 68 may be provided for receiving alternative connector forms or display elements as have been described previously.

The dimensions of the half-height corner connector 260 may be of any suitable height, generally corresponding to the height of the horizontally oriented modular display panels 10 that are to be joined. The width and length of the half-height corner connector 260 should correspond to the depth of the frame assembly 40 of the display panel that the half-height corner connector 260 is to be secured to. In an embodiment, the width and length of the half-height corner connector 260 are the same, and each correspond to the depth of the frame assembly depicted in FIGS. 9 and 10. In an exemplary embodiment, the half-height corner connector 260 is dimensioned to have a height of 45 inches, and a width and length each of 4 inches.

In an embodiment, it is contemplated that multiple display panels, along with multiple corner connectors may be utilized to create modular display system 1 provided as an enclosed structure, such as a structure that from normal viewing angles is completely enclosed on all sides and corners with the display surface. Such a system may be in the form of a rectangular or square box display. It is recognized that the use of alternative corner connectors providing different angles, in addition to or instead of the right angles depicted in the figures, or by having one or both of inside and outside corner configurations, the end shape of such an enclosed display system is limited only by resources, and imagination. As an example, a four-sided box may be created using one or more display panels to create a first face of the display system, one or more display panels to create a second face of the display system, one or more display panels to create a third face of the display system, and one or more display panels to create a fourth face of the display system. To provide a rectangular arrangement, the first and third faces should contain an arrangement of panels or multiple connected panels, to provide the same length. Similarly, the second and fourth faces should be of the same length, using the same or different panel combinations. A corner connector as taught herein should be provided to connect each of the adjoining faces together to form a box structure, such as by connecting a male end of the first face to the female end of the second face via a corner connector provided to create a 90-degree corner. The male end of the second face connects via another corner connector to the female end of the third face, again by a corner connector. The male end of the third connector would then connect via corner connector to the female end of the fourth face, whereupon the male end of the fourth face would connect via a corner connector to the female end of the first face. With each of the faces connected male to female about the perimeter of the rectangle, and utilizing corner connectors at each junction, and enclosed rectangular display surface can be created for the system 1. The dimensions of the display system 1 can be adjusted easily by using more or less, or different dimension panels to provide a desired length for each face. The height of the display system may be increased by providing horizontally arranged display panels 10 positioned atop the vertically oriented panels about the perimeter, again, using the appropriate corner connectors for the half height panels.

The foregoing illustrates some of the possibilities for practicing the invention. Many other embodiments are possible within the scope and spirit of the invention. The disclosed invention utilizes the above identified components, as a system, in order to more efficiently construct a modular display system 1 for a particular purpose. Therefore, more, or less of the aforementioned components can be used to conform to that particular purpose. It is, therefore, intended that the foregoing description be regarded as illustrative, rather than limiting, and that the scope of the invention is given by the appended claims together with their full range of equivalents.

What is claimed is:

1. A display panel system, comprising:
   at least one modular display panel configured to be releasably secured to at least one other modular display panel, the modular display panel providing a panel, a frame assembly, and a jack assembly;
   the panel providing a display surface on the front and configured to be releasably secured to the frame assembly;
   the frame assembly comprising a rectangular structure having a first stile, a second stile, a top plate, a bottom plate, and at least one toggle arranged between the top plate and the bottom plate, the first stile having at least one first connector and trifunctional mortise, the second stile having at least one second connector and trifunctional mortise; and
   the jack assembly comprising a jack leg pivotably secured to the frame assembly, and a locking brace pivotably secured to the jack leg.

2. The display panel system of claim 1, wherein the trifunctional mortise is a single cavity defining a first region, a second region and a third region, the first region being configured to receive at least one tenon therein, the second region being configured to receive a first connector therein, and the third region providing a first key passageway.

3. The display panel system of claim 2, wherein at least one of the top plate or bottom plate has at least one first connector and a bifunctional mortise.

4. The display panel system of claim 3, wherein the bifunctional mortise is a single cavity defining a first region configured to receive a second connector therein, and a second region providing a second key passageway.

5. The display panel system of claim 1, wherein the first region of the trifunctional mortise is discontinuous and is configured to receive a pair of tenons, one directed into each of the discontinuous portions.

6. The display panel system of claim 1, wherein the modular display panel is rectangular and provides a height to width ratio that is selected from 2:1, 3:1, 4:1, and 1:1.

7. The display panel system of claim 1, wherein the modular display panel has a plurality of female connectors in a first stile, and a plurality of male connectors in a second stile, wherein each the female connector of the plurality of female connectors is aligned with a male connector of the plurality of male connectors.

8. The display panel system of claim 7, wherein the modular display panel has at least one male connector on the top plate, and at least one female connector on the bottom plate.

9. The panel display system of claim 8, wherein the at least one modular display panel comprises three modular display panels, arranged in a configuration having two modular display panels positioned vertically, and a third modular display panel positioned horizontally atop the other two modular display panels.

10. The display panel system of claim 1, wherein the panel is self-supporting, and provides a display surface, and a back surface having at least one releasable fastener clip configured to be received by a corresponding receiver mechanically secured to the frame assembly.

11. The display panel system of claim 1, wherein the at least one toggle of the frame assembly is four toggles, and the lowermost toggle is configured to receive a portion of the locking brace.

12. The display panel system of claim 11, wherein the frame assembly further includes a first stile rail, a second stile rail, a top plate rail, a bottom plate rail, and a toggle rail for each of the four toggles.

13. The display panel system of claim 11, wherein each of the four toggles provide a biased tenon arrangement on one end of each of the four toggles.

14. The display panel system of claim 1, wherein the jack leg provides a spine, a diagonal brace extending diagonally away from the top of the spine, and a horizontal leg extending horizontally out from the bottom of the spine.

15. The display panel system of claim 14, wherein the horizontal leg ends in a downward protruding foot.

16. The display panel system of claim 14, wherein the jack leg provides at least one weight receiving feature.

17. The panel display system of claim 14, wherein the jack leg is configured to pivot between a first position and a second position, the first position of the jack leg having the jack leg stowed entirely within the outside dimensions of the frame assembly, and the second position of the jack leg having the jack leg protruding perpendicularly away from the panel.

18. The panel display system of claim 17, wherein the locking brace is configured to pivot between a storage position and a locking position, the first storage position of the locking brace having the locking brace folded against the jack leg, and the locking position of the locking brace having the locking brace positioned protruding perpendicularly away from the jack leg, with an engagement portion of the locking brace mechanically engaged with the bottom toggle.

19. The panel display system of claim 14, wherein the jack leg further comprises a diagonal rail extending between the spine at a mid-point of the spine to the diagonal brace at a mid-point of the diagonal brace.

20. The panel display system of claim 1, further comprising a corner connector configured to join a pair of modular display panels in a non-planar configuration.

* * * * *